US007408258B2

(12) United States Patent
Salmon

(10) Patent No.: US 7,408,258 B2
(45) Date of Patent: Aug. 5, 2008

(54) INTERCONNECTION CIRCUIT AND ELECTRONIC MODULE UTILIZING SAME

(75) Inventor: Peter C. Salmon, Mountain View, CA (US)

(73) Assignee: Salmon Technologies, LLC, Mountain View, CA (US)

( * ) Notice: Subject to any disclaimer, the term of this patent is extended or adjusted under 35 U.S.C. 154(b) by 306 days.

(21) Appl. No.: 10/783,662

(22) Filed: Feb. 20, 2004

(65) Prior Publication Data

US 2005/0040513 A1 Feb. 24, 2005

Related U.S. Application Data

(60) Provisional application No. 60/496,948, filed on Aug. 20, 2003.

(51) Int. Cl.
*H01L 23/04* (2006.01)
(52) U.S. Cl. .................. 257/699; 257/698; 257/706
(58) Field of Classification Search ............. 257/698, 257/700, 706, 707, 778, 714
See application file for complete search history.

(56) References Cited

U.S. PATENT DOCUMENTS

| 4,455,654 | A | | 6/1984 | Bhaskar et al. ............... 714/28 |
|---|---|---|---|---|
| 4,748,495 | A | | 5/1988 | Kucharek .................... 257/713 |
| 4,862,322 | A | | 8/1989 | Bickford et al. ............. 361/718 |
| 4,912,844 | A | | 4/1990 | Parker .......................... 29/848 |
| 4,997,791 | A | | 3/1991 | Ohuchi et al. ............... 437/209 |
| 5,001,548 | A | | 3/1991 | Iversen ........................ 257/714 |
| 5,159,529 | A | | 10/1992 | Lovgren ...................... 361/699 |
| 5,162,974 | A | | 11/1992 | Currie ......................... 361/702 |
| 5,214,250 | A | | 5/1993 | Cayson et al. ................ 438/73 |
| 5,239,200 | A | | 8/1993 | Messina et al. .............. 257/714 |
| 5,239,448 | A | * | 8/1993 | Perkins et al. ............... 361/764 |
| 5,267,867 | A | | 12/1993 | Agahdel et al. ................ 439/73 |

(Continued)

FOREIGN PATENT DOCUMENTS

JP 07169873 A 7/1995

OTHER PUBLICATIONS

Chow, Eugene M. et al., "Process Compatible Polysilicon-Based Electrical Through-Wafer Interconnects in Silicon Substrates", Journal of Microelectromechanical Systems, vol. 11, No. 6, Dec. 2002, pp. 631-640.

(Continued)

*Primary Examiner*—S. V. Clark
(74) *Attorney, Agent, or Firm*—Dorsey & Whitney LLP

(57) ABSTRACT

A method for fabricating copper-faced electronic modules is described. These modules are mechanically robust, thermally accessible for cooling purposes, and capable of supporting high power circuits, including operation at 10 GHz and above. An imprinting method is described for patterning the copper layers of the interconnection circuit, including a variation of the imprinting method to create a special assembly layer having wells filled with solder. The flip chip assembly method comprising stud bumps inserted into wells enables unlimited rework of defective chips. The methods can be applied to multi chip modules that may be connected to other electronic systems or subsystems using feeds through the copper substrate, using a new type of module access cable, or by wireless means. The top copper plate can be replaced with a chamber containing circulating cooling fluid for aggressive cooling that may be required for servers and supercomputers. Application of these methods to create a liquid cooled supercomputer is described.

18 Claims, 19 Drawing Sheets

U.S. PATENT DOCUMENTS

| | | | | |
|---|---|---|---|---|
| 5,281,151 A * | 1/1994 | Arima et al. | | 439/68 |
| 5,290,970 A | 3/1994 | Currie | | 174/250 |
| 5,291,064 A * | 3/1994 | Kurokawa | | 257/714 |
| 5,300,810 A | 4/1994 | Eden | | 257/686 |
| 5,305,184 A | 4/1994 | Andresen et al. | | 361/699 |
| 5,334,279 A | 8/1994 | Gregoire | | 216/20 |
| 5,367,593 A | 11/1994 | Lebby et al. | | 385/53 |
| 5,390,412 A | 2/1995 | Gregoire | | 29/848 |
| 5,451,722 A | 9/1995 | Gregoire | | 174/261 |
| 5,510,758 A * | 4/1996 | Fujita et al. | | 333/247 |
| 5,579,574 A | 12/1996 | Colleran et al. | | 29/840 |
| 5,627,406 A | 5/1997 | Pace | | 257/700 |
| 5,635,767 A * | 6/1997 | Wenzel et al. | | 257/778 |
| 5,640,051 A * | 6/1997 | Tomura et al. | | 257/778 |
| 5,736,850 A | 4/1998 | Legal | | 324/158.1 |
| 5,774,475 A | 6/1998 | Qureshi | | 714/726 |
| 5,786,986 A | 7/1998 | Bregman et al. | | 361/719 |
| 5,800,060 A | 9/1998 | Speckbrock et al. | | 374/104 |
| 5,847,936 A * | 12/1998 | Forehand et al. | | 361/794 |
| 5,900,738 A | 5/1999 | Khandros et al. | | 324/761 |
| 5,959,462 A | 9/1999 | Lum | | 324/765 |
| 5,972,152 A | 10/1999 | Lake et al. | | 156/247 |
| 5,986,887 A | 11/1999 | Smith et al. | | 361/704 |
| 5,998,738 A | 12/1999 | Li et al. | | 174/250 |
| 6,005,198 A | 12/1999 | Gregoire | | 174/262 |
| 6,103,554 A | 8/2000 | Son et al. | | 438/126 |
| 6,121,676 A | 9/2000 | Solberg | | 257/686 |
| 6,138,348 A | 10/2000 | Kulesza et al. | | 29/840 |
| 6,161,921 A | 12/2000 | Bard et al. | | 347/55 |
| 6,174,804 B1 | 1/2001 | Hsu | | 438/238 |
| 6,208,511 B1 | 3/2001 | Bortolini et al. | | 361/698 |
| 6,225,688 B1 | 5/2001 | Kim et al. | | 257/686 |
| 6,246,010 B1 | 6/2001 | Zenner et al. | | 174/260 |
| 6,304,447 B1 | 10/2001 | Bortolini et al. | | 361/699 |
| 6,310,484 B1 | 10/2001 | Akram et al. | | 324/764 |
| 6,372,549 B2 | 4/2002 | Urushima | | 438/118 |
| 6,392,301 B1 * | 5/2002 | Waizman et al. | | 257/774 |
| 6,416,171 B1 | 7/2002 | Schmidlin | | 347/55 |
| 6,441,476 B1 | 8/2002 | Emoto | | 257/686 |
| 6,460,247 B1 | 10/2002 | Gregoire | | 29/848 |
| 6,462,532 B1 | 10/2002 | Smith | | 324/158.1 |
| 6,480,395 B1 | 11/2002 | Kopf | | 361/760 |
| 6,515,870 B1 | 2/2003 | Skinner et al. | | 361/800 |
| 6,528,891 B2 | 3/2003 | Lin et al. | | 257/778 |
| 6,531,022 B1 | 3/2003 | Tsukahara | | 156/256 |
| 6,587,345 B2 | 7/2003 | Chu et al. | | 361/719 |
| 6,611,057 B2 | 8/2003 | Mikubo et al. | | 257/714 |
| 6,631,344 B1 | 10/2003 | Kapur et al. | | 703/22 |
| 6,677,776 B2 | 1/2004 | Doherty et al. | | 324/765 |
| 6,683,377 B1 | 1/2004 | Shim et al. | | 257/723 |
| 6,717,812 B1 | 4/2004 | Pinjala et al. | | 361/699 |
| 6,722,893 B2 | 4/2004 | Li et al. | | 439/66 |
| 6,763,880 B1 | 7/2004 | Shih | | 165/80.4 |
| 6,784,554 B2 * | 8/2004 | Kajiwara et al. | | 257/778 |
| 6,829,574 B1 | 12/2004 | Ito et al. | | 703/28 |
| 6,845,477 B2 | 1/2005 | Hidaka | | 714/729 |
| 6,880,350 B2 | 4/2005 | Tilton | | 62/171 |
| 6,881,609 B2 | 4/2005 | Salmon | | 438/107 |
| 6,891,732 B2 * | 5/2005 | Takano et al. | | 361/783 |
| 6,927,471 B2 | 8/2005 | Salmon | | 257/499 |
| 6,938,678 B1 | 9/2005 | Bortolini et al. | | 165/80.4 |
| 6,942,493 B2 | 9/2005 | Matsunaga et al. | | 439/66 |
| 6,955,063 B2 | 10/2005 | Adiga et al. | | 62/259.2 |
| 6,956,284 B2 | 10/2005 | Cady et al. | | 257/685 |
| 6,956,285 B2 * | 10/2005 | Radu et al. | | 257/697 |
| 6,973,717 B2 | 12/2005 | Hacke et al. | | 29/840 |
| 6,990,176 B2 | 1/2006 | Sherman et al. | | 378/98.8 |
| 7,009,412 B2 | 3/2006 | Chong et al. | | 324/754 |
| 7,018,917 B2 | 3/2006 | Elers | | 438/622 |
| 7,040,383 B2 | 5/2006 | Oyamada | | 165/104.33 |
| 7,078,926 B2 | 7/2006 | Khandros et al. | | 324/765 |
| 7,163,830 B2 | 1/2007 | Salmon et al. | | 438/18 |
| 7,180,165 B2 | 2/2007 | Ellsbury et al. | | 257/686 |
| 7,254,024 B2 | 8/2007 | Salmon | | 361/699 |
| 2002/0030975 A1 | 3/2002 | Moon | | 361/749 |
| 2002/0121689 A1 * | 9/2002 | Honda | | 257/700 |
| 2003/0035473 A1 | 2/2003 | Takinosawa | | 375/224 |
| 2003/0106004 A1 | 6/2003 | Richetti et al. | | 714/733 |
| 2003/0167144 A1 | 9/2003 | Wang et al. | | 702/119 |
| 2003/0168725 A1 | 9/2003 | Warner et al. | | 257/686 |
| 2004/0012383 A1 | 1/2004 | Kimura | | 324/158.1 |
| 2004/0148121 A1 | 7/2004 | deObaldi et al. | | 702/117 |
| 2004/0176924 A1 | 9/2004 | Salmon | | 702/125 |
| 2005/0168231 A1 | 8/2005 | Kim | | 324/754 |
| 2005/0184376 A1 | 8/2005 | Salmon | | 257/686 |
| 2005/0255722 A1 | 11/2005 | Salmon | | 439/67 |
| 2006/0077638 A1 | 4/2006 | Salmon | | 361/704 |
| 2006/0131728 A1 | 6/2006 | Salmon | | 257/698 |
| 2006/0209512 A1 | 9/2006 | Taniguchi et al. | | 361/699 |
| 2007/0007983 A1 | 1/2007 | Salmon | | 324/754 |
| 2007/0023889 A1 | 2/2007 | Salmon | | 257/690 |
| 2007/0023904 A1 | 2/2007 | Salmon | | 385/49 |
| 2007/0023923 A1 | 2/2007 | Salmon | | 257/296 |
| 2007/0025079 A1 | 2/2007 | Salmon | | 361/699 |

OTHER PUBLICATIONS

David & Arledge, "Thin Film Metallization of Three Dimensional Substrates", Electronic Components Technology Conference, Proceedings 44th, May 1-4, 1994, pp. 359-361.

Gutmann, R.J. et al., "Wafer-Level Three-Dimensional Ics: A Better Solution Than SoCs and SiPs?", 6 pages.

Holden, Happy, "A Design Technology Innovation—The Power Mesh Architecture for PCBs", The Board Authority, Dec. 2000, pp. 2-6.

Kreider, Kennteh G. et al., "High Temperature Materials For Thin-Film Thermocouples On Silicon Wafers", Chemical Science and Technology Laboratory, NIST, Gaithersburg, Maryland, USA.

Sensu, Yoshihisa et al., "Study on Improved Resolution of Thick Film Resist (Verification by Simulation)", SPIE, 2001.

* cited by examiner

INTERCONNECTION CIRCUIT AND ELECTRONIC MODULE UTILIZING SAME

RELATED APPLICATIONS

This application claims priority to provisional Application Ser. No. 60/496,948 filed Aug. 20, 2003.

BRIEF DESCRIPTION OF THE INVENTION

This invention relates to apparatus and method for building microelectronic modules having one or two conductive faceplates, imprinting methods, and their application to blade servers and supercomputers.

BACKGROUND OF THE INVENTION

Conventional printed circuit boards are constructed using copper signal planes laminated between glass-epoxy layers. Copper planes (foils) are also used for ground and for power supply voltages. For conventional epoxy laminate boards, trace and space dimensions are typically 100 microns each for a trace pitch of 200 microns, and hole diameters for plated through holes are typically 340 microns or more. More advanced boards are available from companies such as Unitive, Inc. of Research Triangle Park, N.C., USA. Unitive's boards employ BCB, a spin-on resin available from Dow Chemical Company, rather than glass-epoxy. For a copper trace thickness of 2-3 microns, these boards achieve trace widths as small as 12 microns and trace spacing as small as 13 microns; traces on different levels are connected using vias with a diameter of 35 microns and a pitch of 45-55 microns.

At 10 GHz the dielectric constant of BCB is 2.65 and its dissipation factor is 0.002. Its coefficient of thermal expansion (CTE) is 52 ppm/° C., and its moisture uptake is 0.14% by weight (as reported by Dow Chemical). Moisture uptake is critical because small amounts of absorbed water can substantially raise the effective dielectric constant, and a higher dielectric constant may effectively prohibit high frequency operation. The CTE of copper is 17 ppm/° C.; various researchers list the CTE of silicon as 2.6-4.2 ppm/° C. The coefficients of thermal expansion are important because the manufacturing process typically requires thermal cycles, and mismatches in CTE between materials in a stacked configuration result in mechanical stresses that can damage the board, or components attached to it. Additional thermal cycling is typically present during operation of the board, but usually this variation is less than during manufacturing and assembly.

In recent years, imprinting methods have been developed for several products. An example is the compact disc (CD) that has been manufactured by pressing a master tool into a plastic material, leaving an imprint of the desired pattern. A feature size of one micron and a fabrication cost less than a dollar per square foot have been reported. For both integrated circuit manufacture and printed circuit board manufacture, the imprinting method has potential to be an inexpensive patterning method compared with current photolithographic patterning methods. Photolithography has been the mainstay of integrated circuit patterning for many decades; it generally requires highly sophisticated tools for projecting a beam of light through a mask onto photosensitive materials. A fabrication facility to process silicon wafers by this method typically costs more than US$1 B today. By contrast, imprinting requires unsophisticated tools, yet it can produce fine features, smaller than 100 nanometers in some applications. The tools required for imprinting generally include a laminating press with provisions for aligning the layers, and for heating the thermoplastic material to be patterned. Cold embossing has also been developed using glass tools with embossed features etched therein, and UV curable dielectrics.

Electroplating is typically used to build up the copper layers, and chemical/mechanical polishing (CMP) is preferably used for planarizing each layer after plating. Imprinting and CMP methods can be combined to implement a dual damascene process using copper as the conductor material. Dual damascene processes are known in the art; "dual" refers to the fact that two depths of copper are implemented: trenches used for creating traces have a lesser depth than cylindrical holes for vias. The combination of tools for imprinting, plating and CMP may cost less than 1% of the cost of equivalent photolithographic tools. Other conductors may be used instead of copper, but copper offers a compelling combination of good electrical and thermal conductivity, adequate mechanical properties (especially in the form of dispersion strengthened copper, to be further discussed), and an infrastructure of existing tools and processes for drilling, electroplating, etching, and polishing at reasonable cost.

Liquid crystal display (LCD) panel fabrication plants are now being built for glass panels measuring 1870×2200 mm. The thickness of these glass panels is 0.7 mm, similar to the preferred thickness of 0.6 mm for copper substrates of the current invention. This means that an infrastructure of semiconductor processing equipment, particularly including thin film coating and etching equipment could be adapted to handle copper substrates in panel sizes up to around 2 meters square. This may be useful for coating thin film adhesion layers and seed layers on large panels of the current invention, and for plasma etching dielectric materials, as will be further described. The photolithographic patterning capability for large panels, generally employing step and repeat exposure systems ("steppers"), may also be used for fabricating the embossing tools described herein.

The preferred method of imprinting discussed herein uses an embossing tool in the form of a flexible foil, hereinafter called a "toolfoil". It is also possible to use rigid embossing tools, particularly if release agents are applied to the tool to aid in separation; also if the impressions are shallow they require a relatively small force for release. A release agent comprised of low surface energy material such as teflon is also preferably provided on the toolfoils discussed herein. One method of making a toolfoil is to electroplate nickel in an additive process to create a master or "father" foil. The sidewalls of the plated features preferably have an angle of about 5° to the vertical. This release angle is useful so that negatives of fathers can be made to produce "mothers", and negatives of mothers are made to produce "sons", which are the equivalent of photo-tool working plates. Suitable toolfoils can be obtained from Tecan Components Ltd., Dorset, England. If the toolfoil is used to implement a dual damascene process, then two nickel thicknesses are required and two photo-tools (glass masks) will be used in the fabrication of the master.

An alternative embodiment of the imprinting method may be used for large patterns that require a step and repeat methodology. Molecular Imprints of Austin, Tex., USA, has developed a step and flash imprint lithography process called S-Fil. In this process, a substrate is coated with an organic planarization layer. Then a low viscosity photo-polymerizable imprint solution is dispensed on the surface. A surface treated transparent template bearing patterned relief structures is aligned over the coated substrate. The template is lowered into contact with the substrate, thereby displacing the solution, filling the imprint field, and trapping the photo-polymerizable imprint solution in the template relief. Irradiation with UV light through the backside of the template cures the solution. The template is then separated from the substrate leaving a relief image on the surface that is a replica of the template pattern. A short halogen etch is used to clear any remaining thin webs of undisplaced material. A subsequent reactive ion etch into the planarization layer may be used to amplify the aspect ratio of the relief image.

Liquid crystal polymer (LCP) is a new dielectric material that has recently become available for imprinting applications in the printed circuit board arena. An example of this material is R/Flex 3800 available from Rogers Corp., Circuit Materials Division, Chandler Arizona. It is available with a CTE matched to copper at 17 ppm/° C. Melting points of 280° C. and 315° C. are available, with thickness varying from 25 microns to 100 microns. From 1-10 GHz the dielectric constant is 2.9 and the dissipation factor is 0.002. The moisture uptake is 0.04% by weight (compared with 0.14% for BCB), resulting in good stability for high frequency applications.

Dispersion strengthening is a method for improving the strength properties of copper, without seriously affecting its electrical and thermal conductivity. Cold rolled sheets of dispersion strengthened copper (DSC) known as Glidcop are available from SCM Metal Products, Inc., North Carolina. For use as a substrate for a printed circuit of the current invention, this material is available in thickness ranging from 125-625 microns. By incorporating minute amounts of aluminum oxide to pin the grain boundaries of the copper, the yield strength of DSC is typically improved by about 10 times, while the thermal and electrical properties are degraded by less than 1%.

Electroplating methods are well known in the art. Current processes support fabrication of via structures with aspect ratios (depth:diameter) as great as 10. Using layered plating solutions and sophisticated power supplies including reverse pulse biasing, void-free plated structures are achievable.

CMP is also well known in the art. A substrate to be polished is held in a polishing chuck so that typically one third of its edge dimension extends below the chuck. A polishing slurry is provided between the exposed surface and a rotating wheel having a finely textured surface; the substrate may simultaneously rotate and orbit in a planetary motion with respect to the wheel. The desired result is a polished planar surface with clearly defined copper features embedded in the dielectric resin.

Modern computer circuits such as multi-chip modules for computer server applications typically operate at GHz frequencies and with large power supply currents at low operating voltages: 200 amps at 1.0V is a typical requirement. Cooling of the module is a critical issue, and building such circuits on a copper substrate can help address the cooling requirements. In addition, a "copper sandwich" will be described having integral copper plates at both the top and bottom of the assembly for improved ruggedness and better thermal access to the heat-producing chips.

Flip chip assembly is generally recognized as the most advanced assembly method in terms of system density and performance. It enables bare integrated circuit (IC) chips to be assembled, in preference to packaged parts. The chips can have area arrays of input/output (I/O) bonding pads, rather than just at the chip periphery. Inductance of these chip-to-board connections is substantially lower than that of wire bonds, and power pins can be located close to the circuit blocks that need the power. Advanced flip chip assembly methods have recently been reported. One such method is to provide gold stud bumps on the IC chips, and corresponding wells filled with solder on the board. This structure supports pad pitches of 100 microns or less and also routine replacement of defective die using a rework process.

There have been two major impediments to the integration of large systems that are exclusively or primarily assembled using flip chip assembly methods: the inability to effectively test such a system (particularly a functional test at full system speed), and the inability to rework defective chips in the assembly. For these reasons, many flip chip assemblies have been limited to 10 IC chips or fewer, because the cost of scrapping defective assemblies becomes prohibitive with a greater number of chips. Solutions to these problems have been recently proposed. Firstly, a special-purpose test chip or chips may be provided on the board under test; working together with a test support computer this chip can provide the means to functionally test the module at full system speed. The test chip preferably includes high speed sampling circuits and comparators that are under control of the support computer. The support computer performs low speed testing chores such as boundary scan and loading of test files, and also hosts diagnostic software for aiding a test operator in determining which chips need to be replaced, if any. Secondly, the proposed variation of flip chip assembly allows effective rework of defective chips. In summary, the rework method is as follows. The board is placed on a hot plate and the temperature is raised to a level just below the melting point of the solder in the wells (the preferred melting point of the preferred In:Ag solder is 143° C.). Then a rework wand emitting hot inert gas is directed at the backside of the defective chip; the solder in the wells melts for this chip, but not for neighboring chips that are not defective. Focused infra red systems have also been deployed for heating the area local to a single chip without melting the solder of surrounding chips. After the solder of the defective chip is molten, the stud bumps are withdrawn from the wells, the surface is inspected and cleaned as necessary, the wells are touched up with additional solder paste as required, and a replacement part is picked, flipped, aligned, and inserted. After re-flowing the solder for the replacement part and validating the assembly with another module test, the rework cycle is complete. There is preferably no epoxy under layer beneath the defective chip (whose removal would be labor intensive, difficult, and potentially damaging to the board). Also, there are no delicate traces around or near the I/O pads that can be damaged during the rework process; the receiving terminal becomes the solder paste in the well rather than the pad. Finally, the materials used easily tolerate the rework temperatures. These factors result in a rework procedure that may be repeated as many times as necessary, enabling the integration of systems comprising hundreds or thousands of IC chips, assembled onto a single monolithic high performance substrate (or blade). This high level of integration in turn enables supercomputer architectures of the current invention.

The purpose of the epoxy under layer between chip and board is to prevent mechanical failure such as cracking that can arise from stresses accompanying temperature excursions that occur during manufacturing or operation. Part of the justification for eliminating this under layer in the proposed flip chip mounting structure is that the preferred arrangement of gold stud bumps inserted into wells filled with solder is mechanically stronger (shear forces can not easily detach a stud bump from its pad or a well from its pad). Because the stud bumps are formed from gold, and because gold is one of the most ductile materials, and because the proposed stud bumps have a pointed shape, the proposed structure is also more mechanically compliant than previous structures such as solder balls re-flowed onto matching lands. In addition, the low melting point of the proposed indium based solder (143° C.) results in lower thermal strains than would occur with commonly used solders that melt at higher temperatures (63:37 Sn:Pb solder melts at 183° C.). Even with this improved flip chip attachment it may be necessary to limit the maximum chip size in the proposed assembly structures, to limit the stress imposed.

For interconnecting modules, module access cables have been proposed that use a similar arrangement of stud bumps and wells as described for attaching the IC chips. These module access cables can support pin pitches of 100 microns or less, and should be re-workable using the same method as outlined for reworking the IC chips.

SUMMARY OF THE INVENTION

The current invention is intended to address the need for microelectronic assemblies that support operating frequencies of the order of 10 GHz (data rates of the order of 10 Gbps), and power supply currents of several hundred amps. An alternative application is to make lower performance electronic assemblies (sub 1 GHz) less expensively than using current printed circuit board and assembly methods.

The preferred embodiment has a base copper layer for mechanical support. A method is described for fabricating feedthroughs in the copper substrate for signals and power. By alternately fabricating layers of dielectric resin and copper conductors, a printed circuit with multiple power and signal planes is built up. Imprinting is used to pattern the layers, preferably using nickel toolfoils. A special assembly layer is preferably fabricated on top of the interconnection circuit wherein a well filled with solder paste is provided at each I/O pad of the board. IC chips are provided with a gold stud bump at each of their I/O pads, and the chips are assembled onto the board by inserting the stud bumps into the wells, then melting the solder to form mechanical and electrical connections. In the preferred embodiment, no epoxy under layer is used between the IC chips and the board. After all the chips are assembled, tested, and reworked as required, a top copper plate may be attached to the backsides of the assembled IC chips, to make a robust mechanical, electrical and thermal package at the module level.

An alternate embodiment supports fabrication of modules such as multi-chip modules (MCMs) or system in package (SIP) devices that are integrated onto a motherboard. The motherboard may be a conventional board employing glass-epoxy laminate for example, or a large interconnection circuit fabricated on a copper substrate using methods described herein. For either case, the copper substrate of the attached module is preferably provided with feeds for power and signals that pass through it and connect to the motherboard, typically on a 1 mm grid.

In the preferred embodiment, imprinting is used to pattern thermo-plastic dielectric layers, and copper conductors are employed. LCP is the preferred dielectric material and DSC is the preferred form of copper for the base layer. After CMP has been used to polish and planarize the surface of a preceding layer, the following sequence summarizes the steps to form the next pair of interleaved dielectric and conducting layers:

a) place a sheet of LCP on top of the polished planar assembly
b) mount a toolfoil on a rigid carrier, align and position on top of the LCP sheet
c) apply heat to soften the LCP
d) apply pressure to imprint the LCP
e) cool to room temperature and separate toolfoil from its carrier
f) peel the toil foil away from the assembly
g) dry etch or sputter etch any remaining web of dielectric material, to expose the copper patterns underneath
h) sputter deposit an adhesion layer such as Ti plus a seed layer of Cu
i) plate Cu to the desired thickness, typically 3-5 microns in the trenches, some of which is removed in the following step
j) CMP to delineate the Cu patterns and planarize the surface A variation of this imprinting procedure will be described for forming the special assembly layer having wells at each of the I/O pads of the interconnection circuit. "Imprinting" and "embossing" are used interchangeably in this application.

These techniques are employed to create copper-faced modules configured as blade servers, plus their integration into liquid-cooled supercomputers of the current invention.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
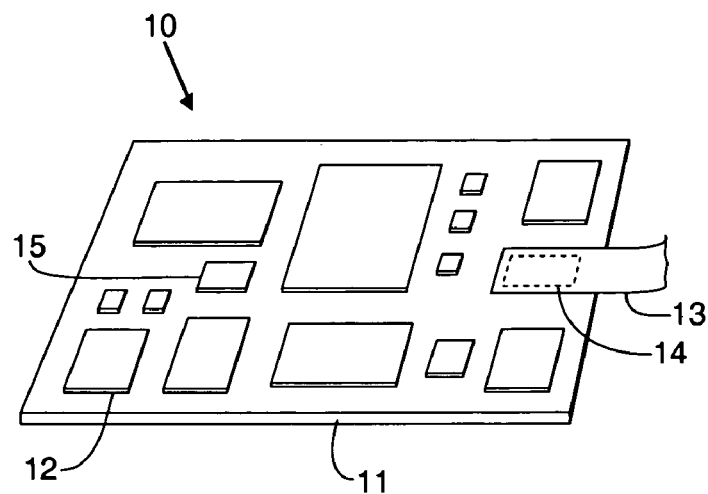
FIG. 1 is a perspective view of a module built on a conductive substrate that uses a module access cable to communicate with other electronic systems.

FIG. 1 shows an electronic module 10 having a conductive substrate 11. (base layer), and multiple integrated circuit chips (IC chips) such as 12 flip chip mounted thereon. Module 10 receives power and communicates with other electronic systems via module access cable 13, utilizing module access port 14, as will be further described. The attachment of IC chips 12 and access cable 13 preferably employ a new version of flip chip assembly wherein each input/output pad of each chip and each cable preferably has a stud bump attached, and each stud bump mates with a well filled with solder formed on top of the interconnection circuit (not shown) fabricated on substrate 11. Detailed manufacturing steps for fabricating these circuits will be described. IC chip 15 may be a test chip, as will be further described. The material of conductive substrate 11 is preferably copper or a dispersion-strengthened copper (DSC). FIG. 1 is an example of a module with a single conductive face.

Figure 2:
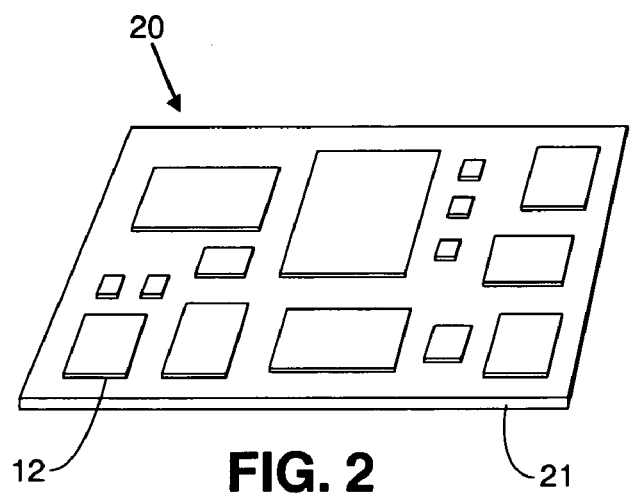
FIG. 2 is a perspective view of a module built on a conductive substrate that uses feeds through the copper plate (not shown) to communicate with a motherboard.

FIG. 2 shows another module 20 with a single conductive face 21 (substrate), except that this substrate has feeds for signals and power (feedthroughs) running through it (not shown), as will be further described. All of the conductive faces in modules and systems described in this application, including substrates and top plates (to be described), are preferably manufactured from copper or DSC. Multiple IC chips such as 12 of FIG. 1 are flip chip mounted as shown.

Figure 3:
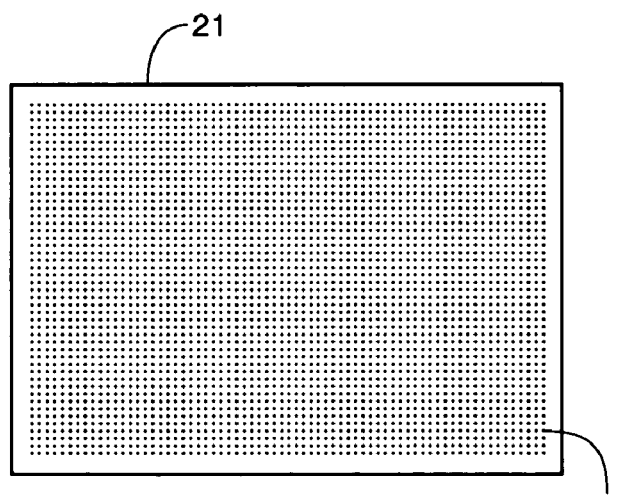
FIG. 3 is a plan view of the underside of a conductive substrate having feedthroughs arranged in a two-dimensional grid.

FIG. 3 shows the backside of substrate 21 including a two-dimensional array of input/output terminals such as 22, preferably arranged on a 1 mm grid. The fabrication of the feedthroughs and terminals will be further described.

Figure 4:
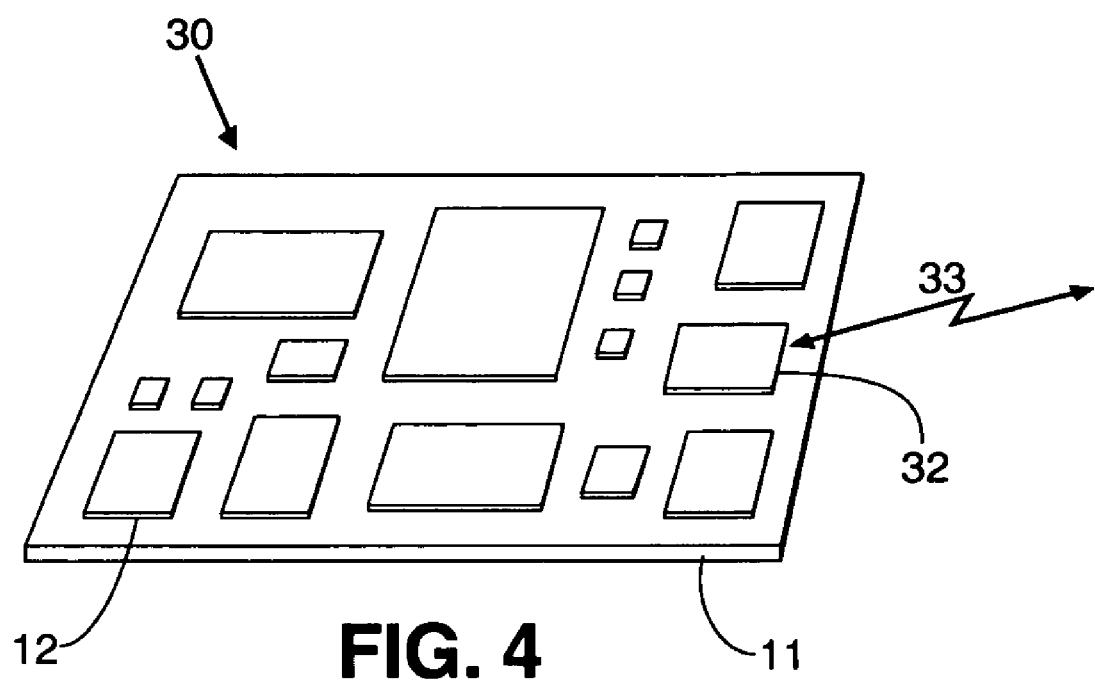
FIG. 4 is a perspective view of a module built on a conductive substrate that uses a wireless link to communicate with other electronic systems.

FIG. 4 shows another module 30 having a single conductive face 11 and multiple IC chips such as 12 flip chip mounted thereon as in FIG. 1, and includes a wireless transceiver chip 32 (or group of chips), that preferably communicates via a two-way radio link 33 with other electronic systems. Power to module 30 may be provided using energy storage devices such as batteries or fuel cells (not shown), or via a cable like 13 of FIG. 1, or via feedthroughs to a motherboard as in module 20 of FIG. 2.

Figure 5:
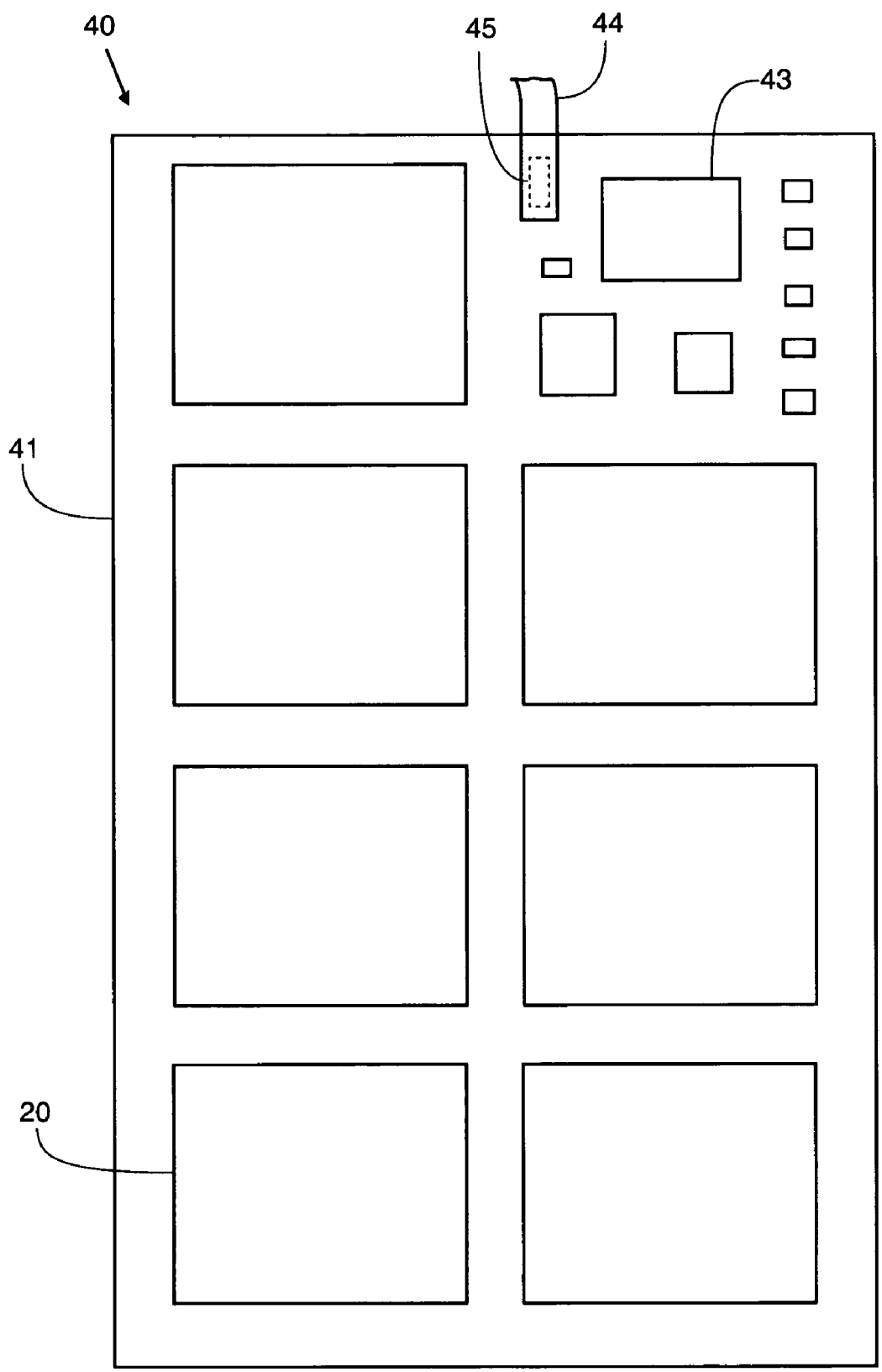
FIG. 5 is a plan view of a system substrate having multiple modules attached, that connects to other electronic systems using a module access cable.

FIG. 5 shows an electronic system 40 including a system substrate 41 (base plate) and multiple modules such as 20 of FIG. 2 mounted thereon. Additional IC chips such as 43 may be included on substrate 41. Chips 43 may be used for testing, for power conversion, for maintenance and administration, for implementing interface protocols and driving communication interfaces, or for diagnostic purposes, as examples. System 40 interfaces to other electronic systems using system access cable 44 connected to system access port 45. However, system 40 may additionally or alternatively communicate with other systems using feeds through substrate 41 to another electronic assembly, or by wireless means.

Figure 6:
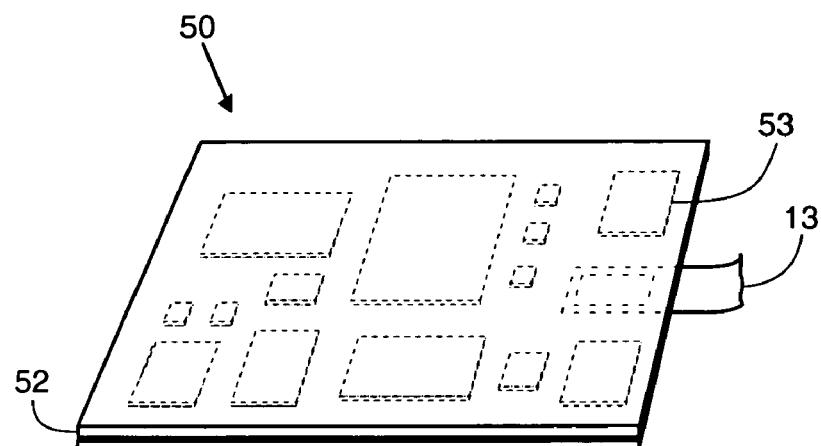
FIG. 6 is a perspective view of a module having two conductive faces that connects to other electronic systems using a module access cable.

FIG. 6 shows electronic module 50 having two conductive faces: substrate 11 as in FIG. 1 and top plate 52. Sandwiched between the two faces are flip chip mounted components such as 53 shown in dotted outline for illustration purposes. Module 50 may communicate with other electronic systems via a module access cable like 13 of FIG. 1. After flip chip assembly (direct attachment) of all of the components onto substrate 11, a grinding or lapping step may be employed to make the components of uniform thickness, and provide a planar surface for attachment of top plate 52. Top plate 52 may be bonded or thermally coupled to the backsides of the IC chips using conductive epoxy or eutectic bonding materials or thermal grease, as is known in the art.

Figure 7:
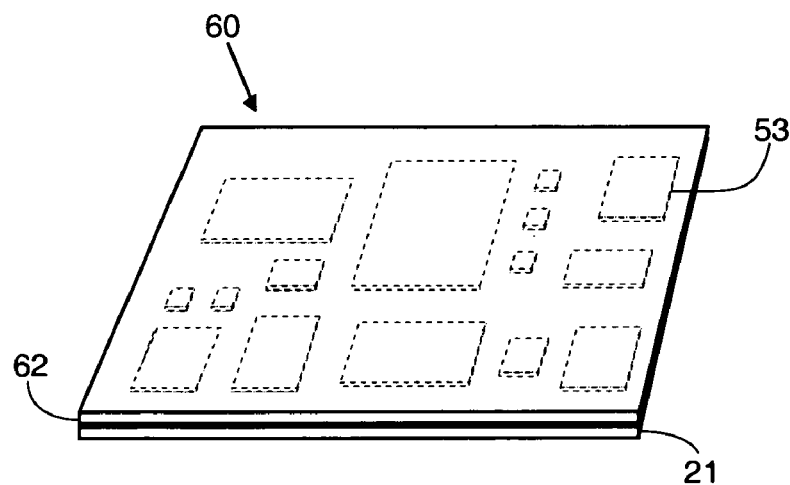
FIG. 7 is a perspective view of a module having two conductive faces that connects to other electronic systems using feeds (not shown) through the bottom conductive face (substrate).

FIG. 7 shows electronic module 60 having two conductive faces: a substrate 21 as in FIG. 2 and a top plate 62. The backside of substrate 21 includes an array of feedthroughs for signals and power, as depicted in FIG. 3.

Figure 8:
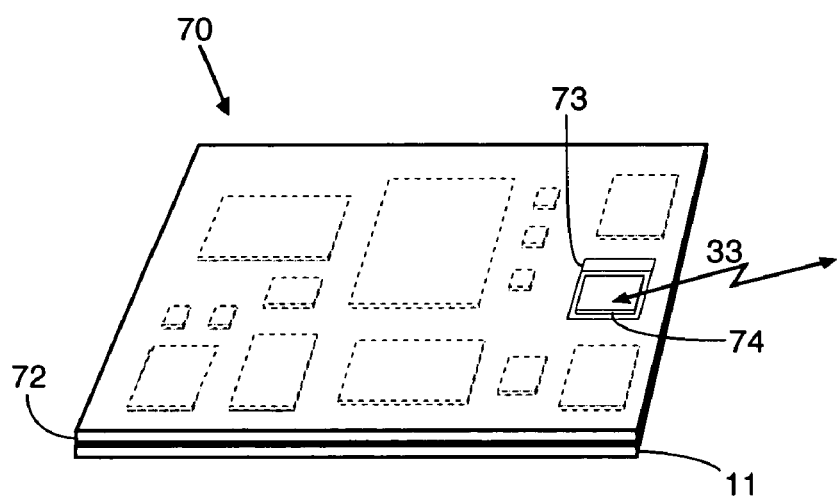
FIG. 8 is a perspective view of a module having two conductive faces that communicates with other electronic systems by wireless means.

FIG. 8 shows module 70 having two conductive faces: substrate 11 as in FIG. 1 and top plate 72. However in contrast with top plate 62 of FIG. 7, top plate 72 has an opening 73 for radio waves to interact with radio transceiver chip 74, to enable a radio link 33 as in FIG. 4.

Figure 9:
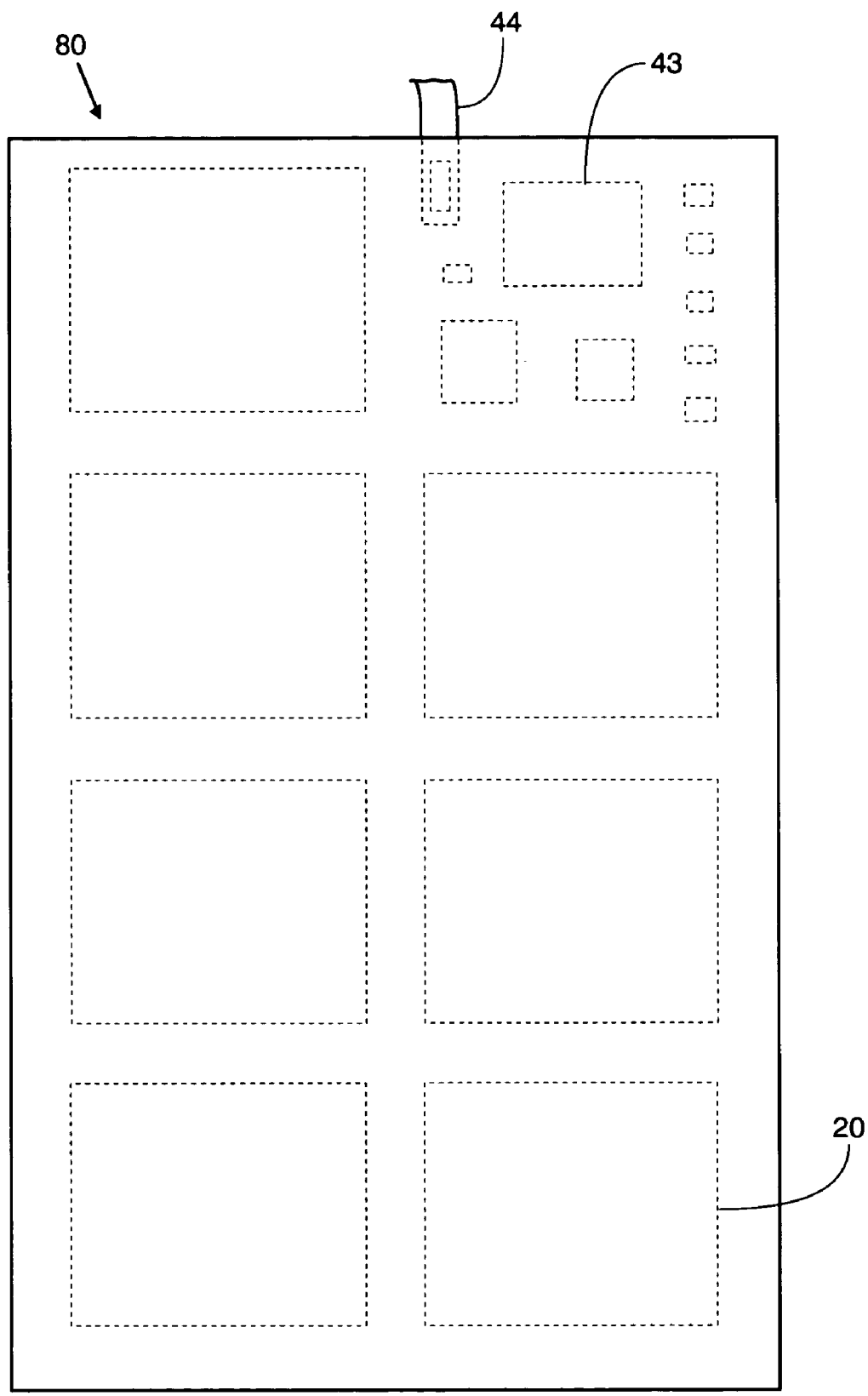
FIG. 9 is a plan view of a system substrate having two conductive faces, with multiple modules attached to the bottom face (substrate), that connects to other electronic systems using a module access cable.

FIG. 9 shows electronic system 80 that is similar to system 40 except that a top plate covers the modules such as 20 of FIG. 2 and IC chips such as 43 of FIG. 5, shown in dotted outline. System 80 communicates with other systems via a system access cable like 44 of FIG. 5, but other communication methods may be additionally or alternatively employed.

Figure 10:
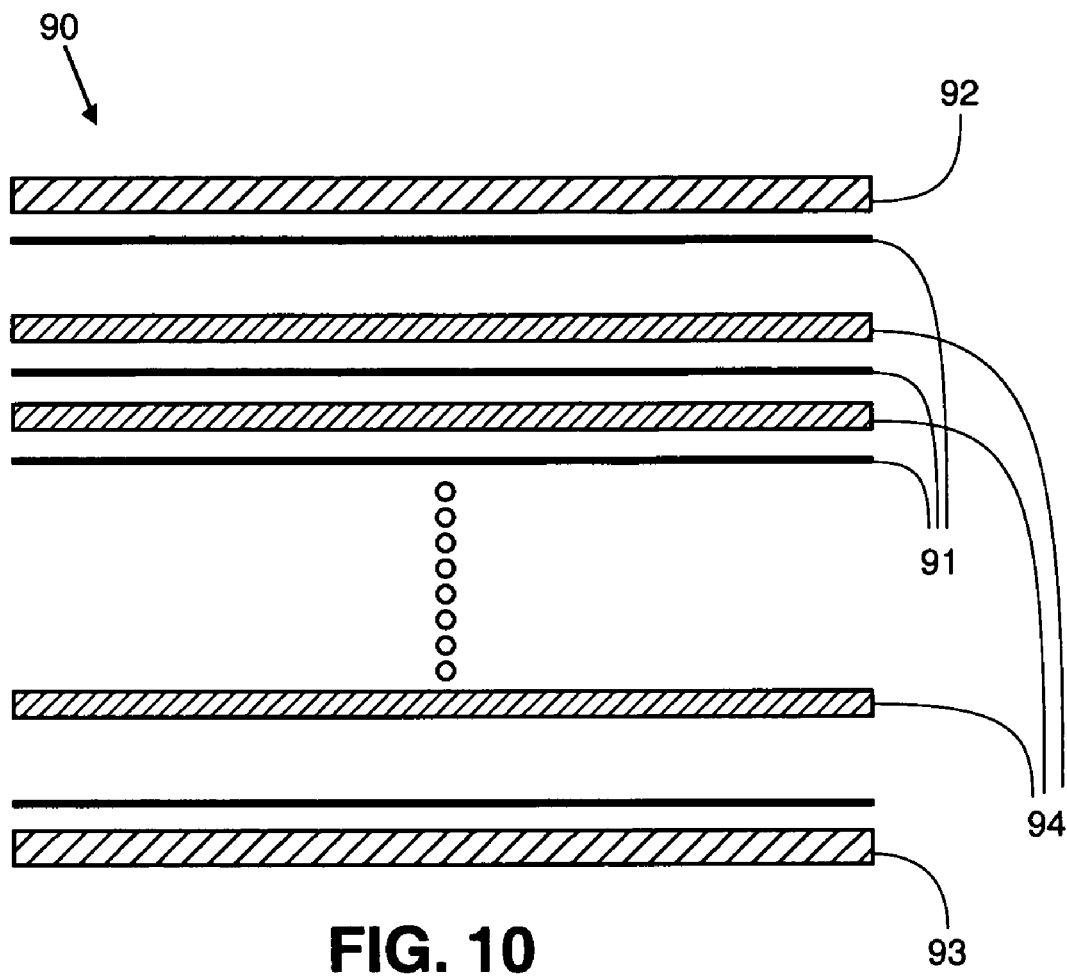
FIG. 10 is a schematic side view of a stack of layers to be laminated for drilling.

FIG. 10 shows a stack of metal layers 90 that can be assembled with layers of wax 91 between each of the metal sheets. This stack is used to drill feedthrough holes in the copper or DSC substrates that include feeds for signals and power. A suitable wax is Ocon-195, and a preferred wax thickness between the metal layers is around 0.008 inches or 200 microns. For the preferred substrate thickness of 600 microns, a suitable drill diameter is 0.0295 inches or 750 microns. A 0.040 inch thick layer of aluminum is preferably provided as a top layer 92 and as a bottom layer 93 of the stack; this provides more cleanly drilled holes at the inner layers, with some tearing permitted at the entry and exit, confined to the aluminum layers. In addition, the interposed wax layers 91 allow the drill to clear between each of the inner layers. A center drill is used to "spot drill" each location with a small diameter hole that is accurately placed, e.g., using a "0" center drill that will create a "dimple" with 0.030 inch diameter. Typically a drilling stack will include 8 layers of 600 micron thick substrate material 94. The preferred drilling machine is a vertical milling center such as the Bridgeport VMC 760. Using the same machine setup, it may also be desirable to mill the outline of the stack to a standard wafer size; the standard shape provides compatibility with mask aligners that may be employed for the lamination step, to be further described.

Figure 11:
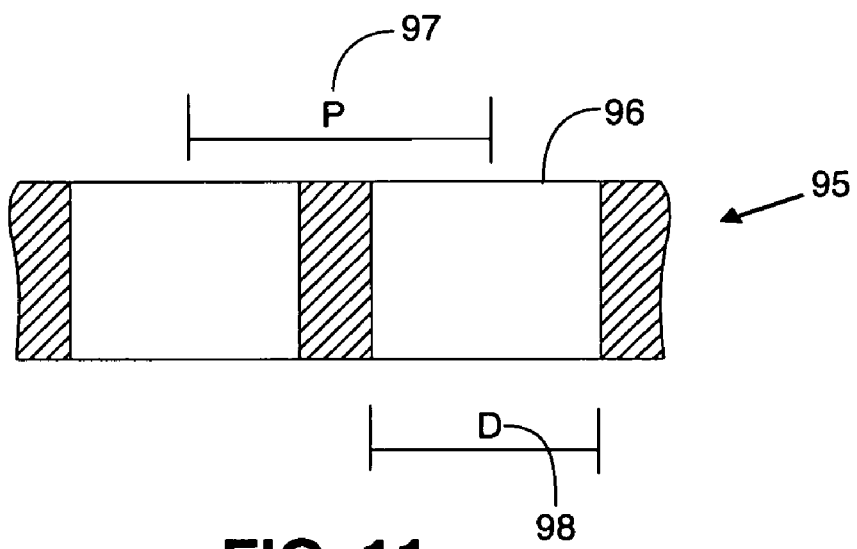
FIG. 11 is a cross-sectional view of a fragment of a conducting substrate having feedthrough holes drilled therein.

FIG. 11 shows a fragment 95 of substrate 21 as in FIG. 2 in which holes 96 have been drilled with a preferred pitch, P, 97 of 1 mm or 1000 microns, and a preferred diameter, D, 98 of 0.0295 inches or 750 microns.

Figure 12:
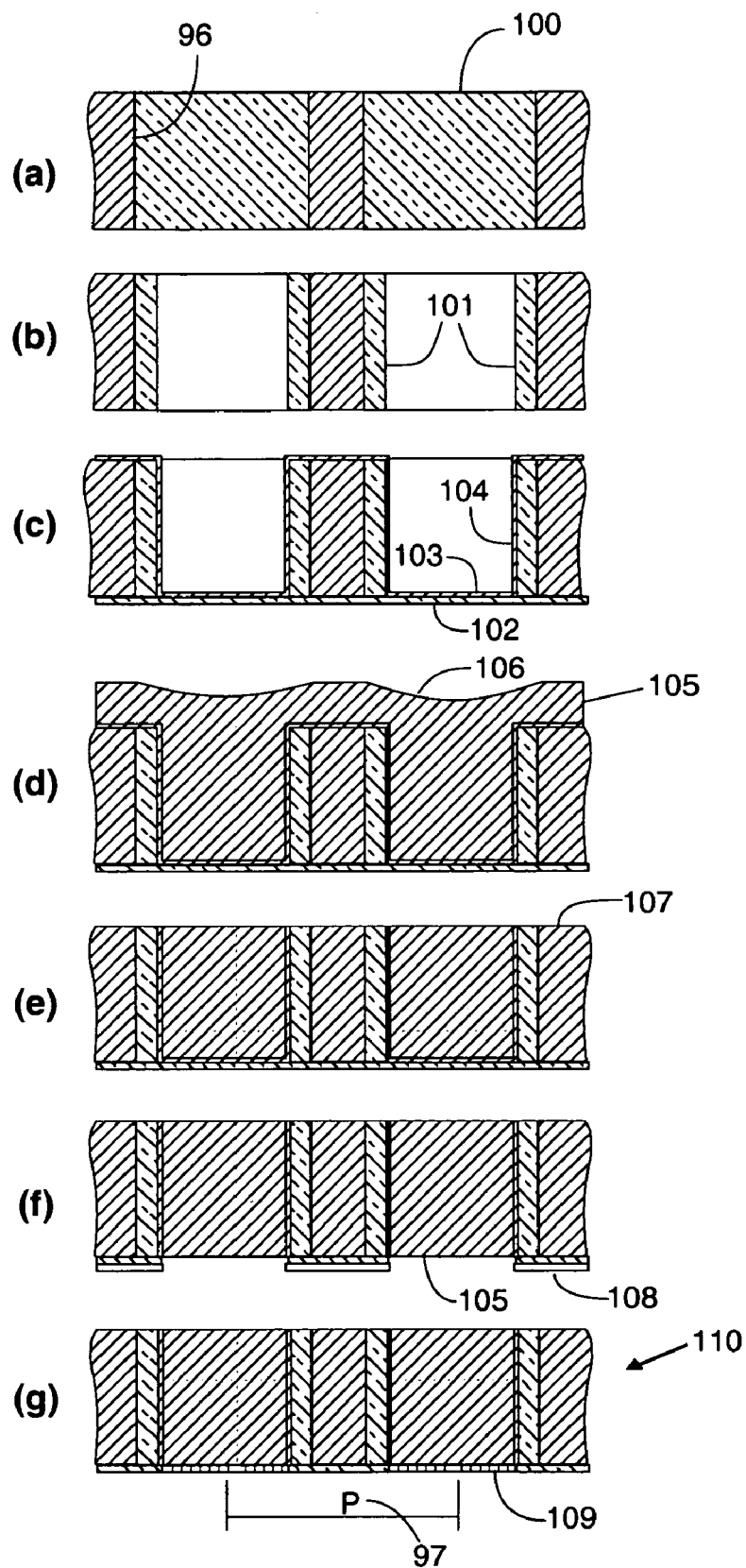
FIG. 12(a)-(g) includes fragmentary cross-sectional views that illustrate the process steps required for fabrication of feedthroughs in a conducting substrate.

FIG. 12 summarizes a preferred process sequence for fabricating feedthroughs in a copper substrate such as 21 of FIG. 2, starting with a substrate layer that has been drilled as in FIG. 11. FIG. 12(*a*) shows that the drilled holes 96 have been filled with a dielectric material 100 such as a liquid crystal polymer. Since the available thickness of LCP may be limited to 100 microns, it may be necessary to stack and laminate 7 or 8 sheets to reliably fill drilled holes 96. After lamination, the top and bottom surfaces are preferably polished using CMP to achieve planarization. FIG. 12(*b*) shows that dielectric material 100 has been concentrically drilled with a preferred drill size of 0.0225 inches or 572 microns. This step may be performed with individual substrates, or with a stack of substrates that has been pre-aligned and bonded with wax. For alignment purposes, 4 separate alignment holes are provided outside the two dimensional array of feedthrough holes, one in each quadrant (not shown). FIG. 12(*c*) shows that a layer of LCP 102 has been laminated onto the bottom of the drilled substrate, and a coating has been deposited that coats the bottom 103 and the walls 104 of drilled aperture 101. Coating 104 includes an adhesion layer such as titanium to a preferred thickness of 300-400 Angstroms or 0.03-0.04 microns, plus a seed layer of copper to a preferred thickness of 500-800 Angstroms or 0.05-0.08 microns. FIG. 12(*d*) shows electroplated copper 105 filling the holes. Advanced plating methods including layered chemicals in the plating bath and pulse-reversing power supplies to effect plating from the bottom up are preferred. An uneven surface 106 results, and this is polished using CMP to achieve the planarized top surface 107 shown in FIG. 12(*e*). FIG. 12(*f*) shows that a masking layer 108 has been deposited and patterned to expose laminated dielectric material 102 at the base of each feedthrough, and this layer has been removed by dry etching through the metal mask to expose electroplated copper material 105. A preferred material for masking layer 108 is aluminum. Finally, FIG. 12(*g*) shows the result of coating the exposed copper with an adhesion layer of titanium plus a seed layer of gold, electroplating gold to form gold contacts 109 on the bottom side of each feedthrough, and etching away masking layer 108. In the preferred embodiment, copper substrate 110 includes copper feedthroughs in a copper substrate that is 0.6 mm thick, having a pitch P, 97, of 1 mm, with a gold contact at the base of each feedthrough.

Figure 13A:
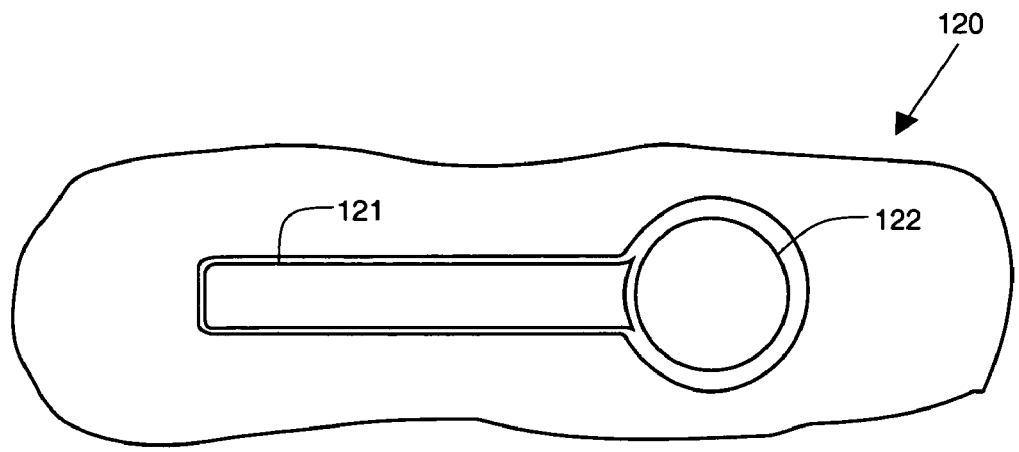
FIG. 13A is a plan view of a fragment of an embossing tool in the form of a toolfoil showing a trench and an associated via.
Figure 13B:
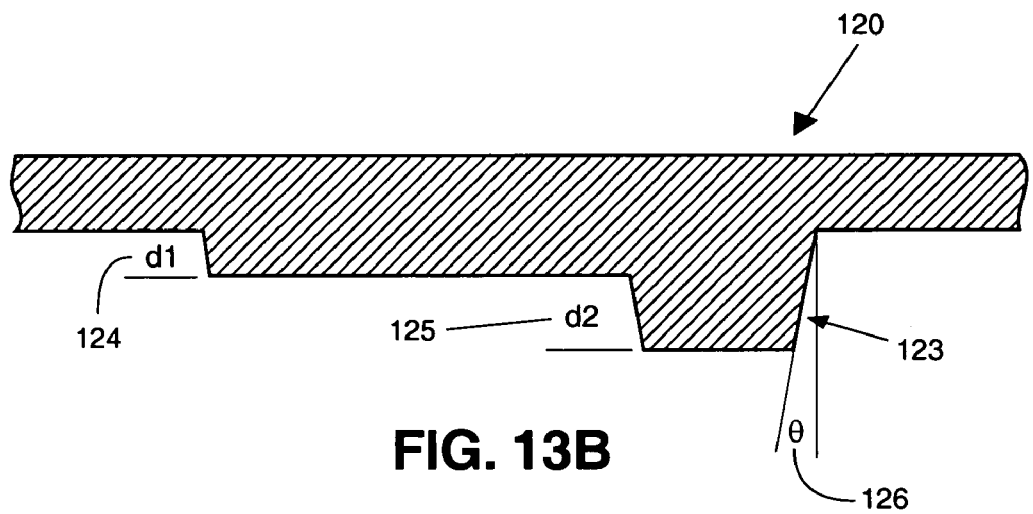
FIG. 13B is a cross-section of the trench and via of the toolfoil shown in FIG. 13A.
Figure 13C:
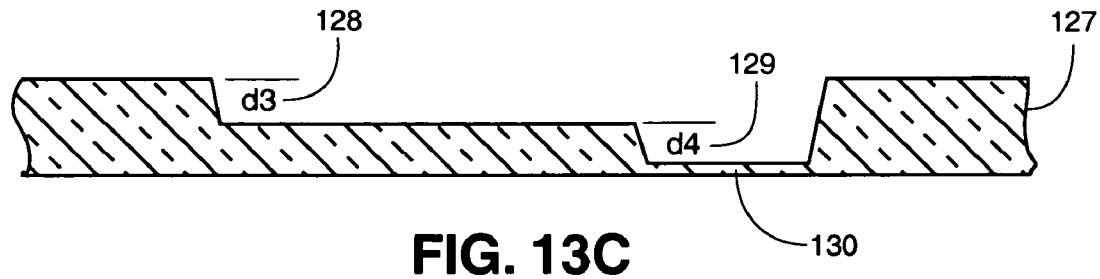
FIG. 13C is a schematic cross-sectional view of an imprint corresponding to the toolfoil of FIGS. 13A and 13B.

FIG. 13A shows a fragment of a toolfoil 120 including a first raised portion 121 for imprinting a trench pattern, and a second raised portion 122 for imprinting a via. FIG. 13B shows profile 123 of the toolfoil features in cross-section. Trench depth d1, 124, and via depth d2, 125, are shown. Release angle θ, 126, is preferably around 5° so that molded parts can be separated from toolfoil 120. It is also preferable to coat toolfoil 120 with a release material having a low surface energy such as teflon. FIG. 13C shows the imprinted pattern achieved by impressing toolfoil 120 with profile 123 into a plastic material such as a heated liquid crystal polymer 127. Typically, the smaller depth d1, 124 is faithfully transferred, and d3, 128 equals d1. However, the larger depth d2, 125 is typically imperfectly transferred due to the spreading characteristics of the plastic material, and d4, 129<d2. For the preferred geometries of the current invention, d1 equals approximately 4 microns, d2 equals approximately 20 microns, d3 equals approximately 4 microns, and d4 equals approximately 16 microns. After plating and polishing, these geometries result in a trace thickness of approximately 2 microns, and a total via depth of approximately 18 microns, with approximately 5 microns of web material 130 removed by dry etching to expose the underlying contact metal (not shown), that is intended to connect with the via metal.

Figure 14:
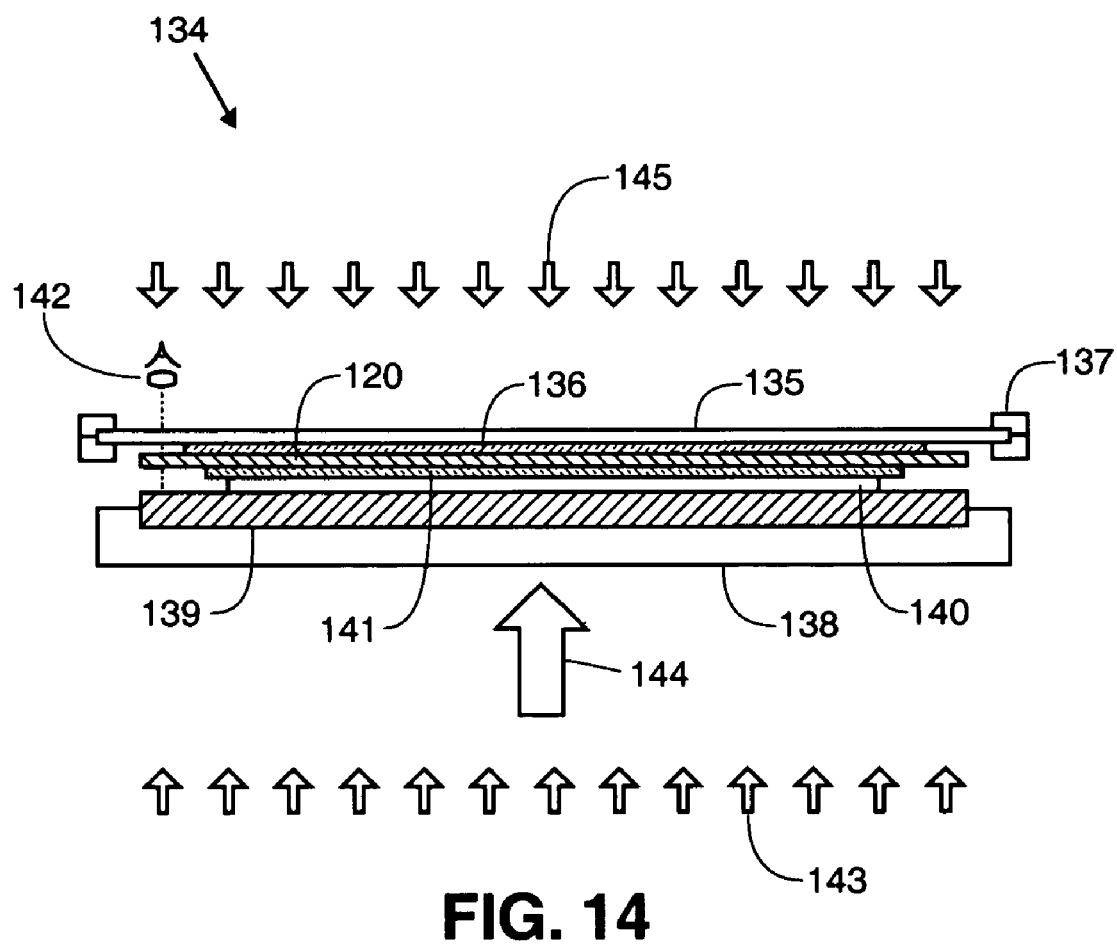
FIG. 14 is a schematic cross-sectional view of an aligner/laminating press for making imprinted patterns of the current invention.

FIG. 14 is a schematic of a laminating press/alignment fixture 134 suitable for making imprints of the current invention. This schematic represents a modified version of a commercial mask aligner, the MA600 available from Suss Microtec. Normally this tool operates with a glass mask (photo tool) held in a mask holder, and a semiconductor wafer held in a wafer chuck. It provides alignment optics for aligning wafer to mask, controlled UV radiation from above for exposing photo resist and other UV sensitive materials, and controlled pressure between mask and wafer up to about 15 pounds per square inch. The modification relates to the addition of infrared heating 143 directed toward the wafer chuck from below, as will be further explained. For the current application, the mask is replaced by an assembly including a glass plate 135 and toolfoil 120 of FIG. 13B bonded to plate 135 using a UV release layer 136. The glass plate is captured in position by mask holder 137. From the bottom side, quartz chuck 138 holds copper substrate 139 (preferably machined in the form of a semiconductor wafer) which may have some interconnection circuit layers 140 already formed on it. A sheet of thermoplastic dielectric material 141 is positioned over interconnection circuits 140, but it is trimmed so as not to cover alignment holes in copper substrate 139. An operator employs alignment optics 142 to align copper substrate 139 with toolfoil 120. Toolfoil 120 has alignment features in the form of apertures that are sized slightly larger than the alignment holes drilled in copper substrate 139. The alignment operator achieves alignment by centering the concentric circles of the two sets of alignment features. Note that "copper substrate", "conductive substrate", and "DSC substrate" are interchangeable in this application. After substrate 139 and toolfoil 120 are properly aligned, heat is applied to copper substrate 139 using infrared radiating lamps positioned in a space underneath quartz chuck 138. The wavelength of IR radiation 143 is carefully selected so that the radiation will not be absorbed by quartz chuck 138, but will be absorbed by copper substrate 139. As substrate 139 heats up, it will emit radiation that can be detected by a sensor below quartz chuck 138 for tracking its temperature during heating and cooling cycles (at temperatures above a certain minimum, depending on the wavelength of the IR radiation). A wavelength of 2.5 microns is suitable in the preferred embodiment. Heating of substrate 139 is monitored until a desired softening point or melting point of the dielectric material is reached. In the preferred embodiment, 280° C. is the melting point of the LCP dielectric. The preferred embossing temperature is around 200° C. so that the LCP remains contained in the embossed layers during each imprint cycle. The required pressure for imprinting will vary with the particular patterns imprinted, the materials used, and the embossing temperature. A process of trial and error is required to determine the optimal pressure for a particular setup; the goal is to provide clean trenches and vias and leave only a thin web of dielectric material to be removed. The thickness of the web for the preferred embodiment is approximately 5 microns (using 25 micron LCP sheets). After imprinting, IR radiation 143 is turned off and the parts are allowed to cool, while force 144 is applied. Then UV exposure 145 is turned on to radiate the UV release material, to effect separation between toolfoil 120 and glass plate 135 as the pressure is released. Substrate 139 with the new imprint pattern is removed from fixture 134, and toolfoil 120 is peeled away.

Figure 15:
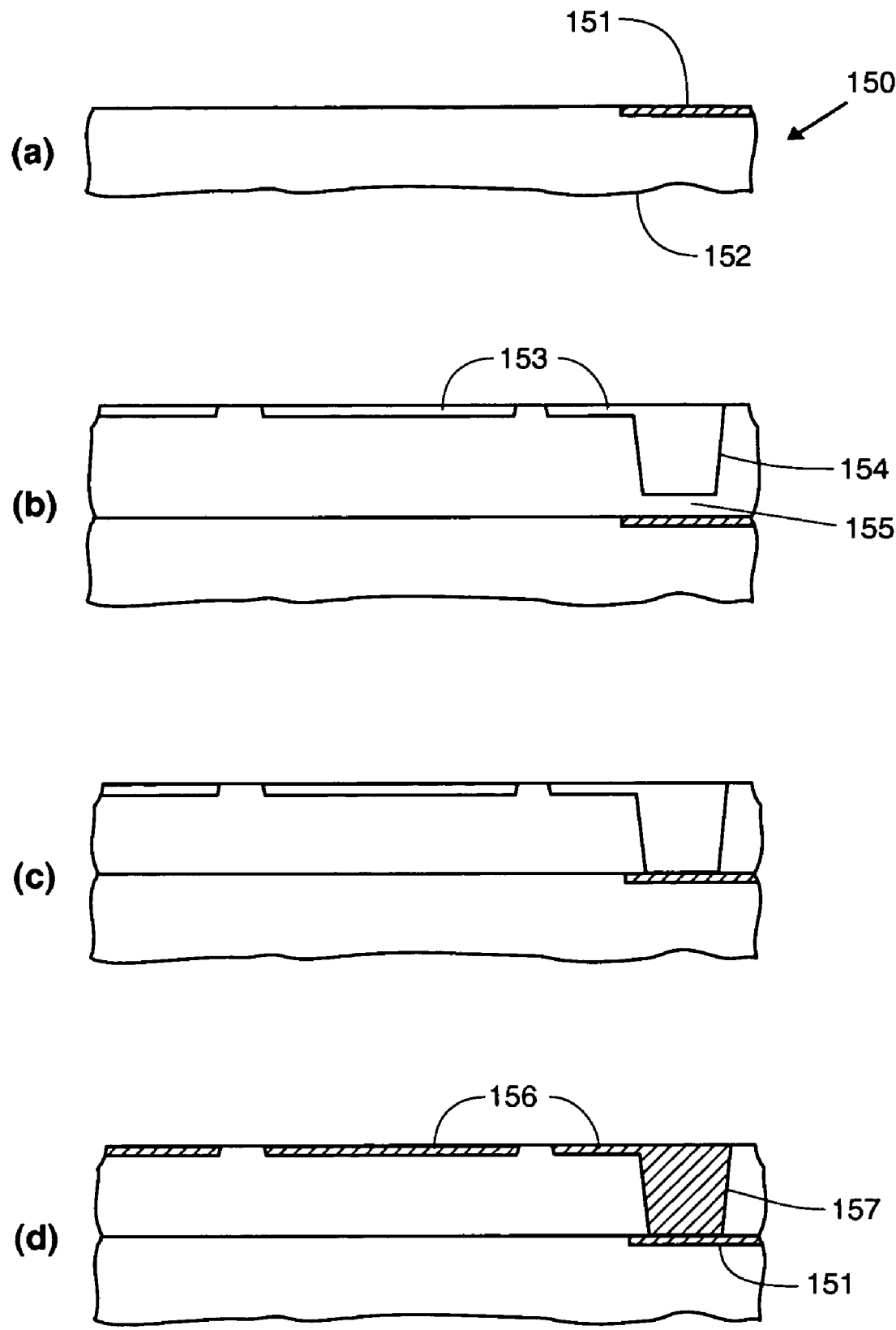
FIG. 15(a)-(d) illustrates in cross-section the process steps to fabricate a pair of interconnection layers including a conductive layer and a dielectric layer.

FIG. 15(*a*) shows a fragment of a pre-existing interconnection circuit 150 that has been planarized and has an exposed contact region 151 on a dielectric material 152. Following an imprinting sequence as described in reference to FIG. 14, trenches 153 and vias 154 are imprinted as shown in FIG. 15(*b*), with a thin web of dielectric material 155 remaining. Web 155 is removed by dry etching or sputter etching, and the profile is as shown in FIG. 15(*c*). An adhesion layer is coated onto the surface, such as 300-400 Angstroms of titanium, followed by a seed layer of copper having a preferred thickness of 500-800 Angstroms. The seed copper is then electroplated from the bottom up, and the top surface is polished to planarize it and to isolate the trench conductors 156 shown in FIG. 15(*d*). The bottom of via 157 is in intimate contact with contact region 151 for a low resistance connection. Because copper and LCP both have CTEs of 17 ppm/° C., there should be minimal distortion or warping of the substrate during manufacture of these layer pairs, particularly if copper is also used as the base substrate layer.

Figure 16:
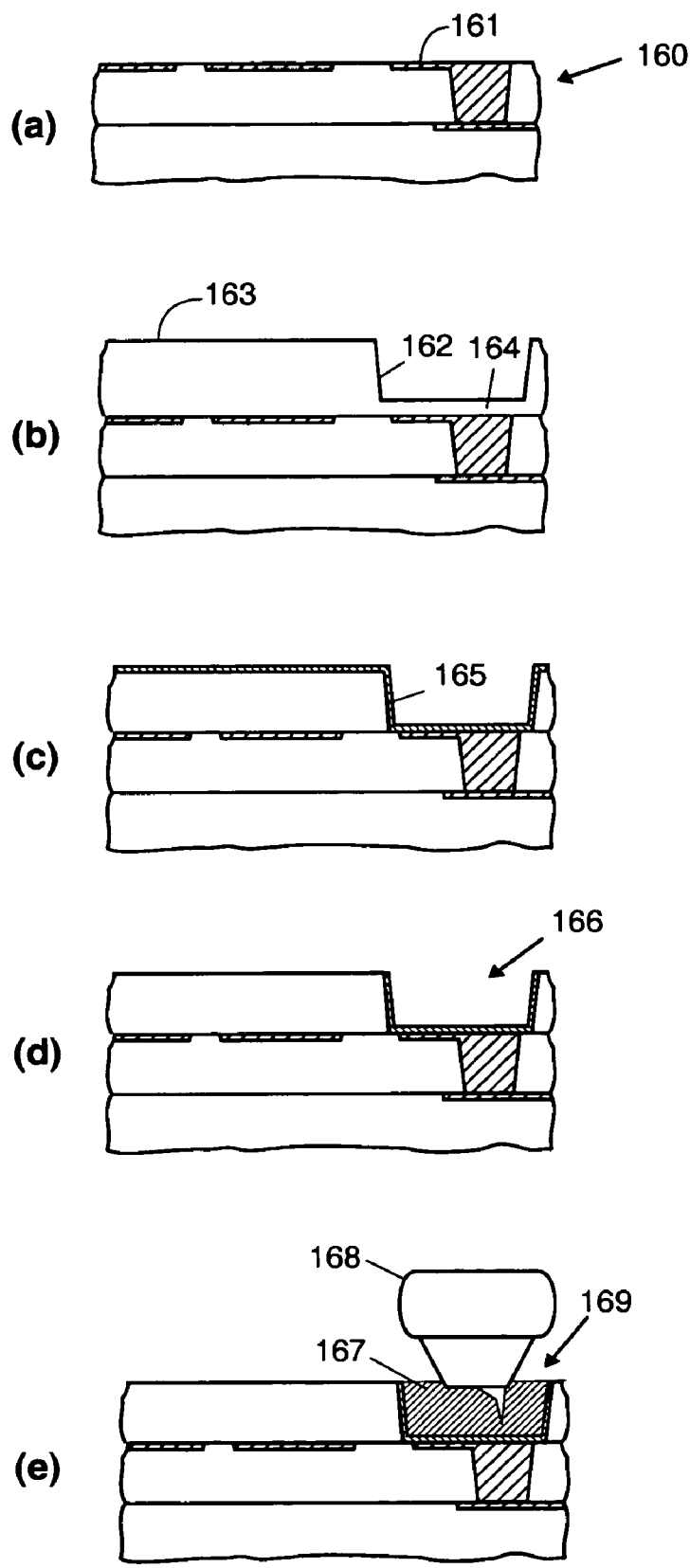
FIG. 16(a)-(e) illustrates in cross-section the process steps to fabricate a special assembly layer including wells filled with solder.

FIG. 16 illustrates a modified imprinting sequence for forming a special assembly layer including wells filled with solder. FIG. 16(*a*) shows a pre-existing interconnection circuit 160 that has been polished and planarized, exposing polished trace 161. FIG. 16(*b*) shows an imprint of a well feature 162, positioned above a conducting trace, fabricated using the procedure described in reference to FIG. 14. Dielectric 163 is preferably BCB that has been applied using a spin-on method. FIG. 16(*c*) shows that the remaining web of dielectric material 164 has been removed, and the top surface has been coated with an adhesion layer of titanium plus nickel to a thickness of approximately 50 micro inches or 1.3 microns. Nickel coating 165 provides a diffusion barrier between the copper traces of the underlying structure and the solder materials to be provided in the well. After polishing and planarization the nickel coating is removed except for coating in the well 166, as shown in FIG. 16(*d*). FIG. 16(*e*) shows that well 166 has been filled with solder paste 167 to form a well filled with solder 169, and a gold stud bump 168 has been inserted. After a reflow cycle to melt solder paste 167, a permanent mechanical and electrical connection is achieved. The preferred solder paste 167 is 3% silver and 97% indium with a melting point of 143° C. Preferred dimensions for a well include a diameter of 55 microns and a depth of 15 microns. By using imprinting to pattern them, economic fabrication is achievable for creating wells at a pitch of 100 microns or less. For logic elements requiring a large number of input/output connections, many thousands or even millions of wells can be filled with paste using one pass of a squeegee. Including the cost of the imprinted layer and a material cost of approximately 0.00008 cents per well for Indalloy 290 at $3.48/gm leads to a manufacturing cost of less than 0.02 cents per well. Coupled with an estimated cost of 0.03 cents per gold stud bump, high density flip chip bonds may be achieved at 0.05 cents per connection. In addition, these bump/well connections are anticipated to be re-workable using simple and effective procedures, without risk of damaging the board to which the components are flip chip mounted.

Figure 17:
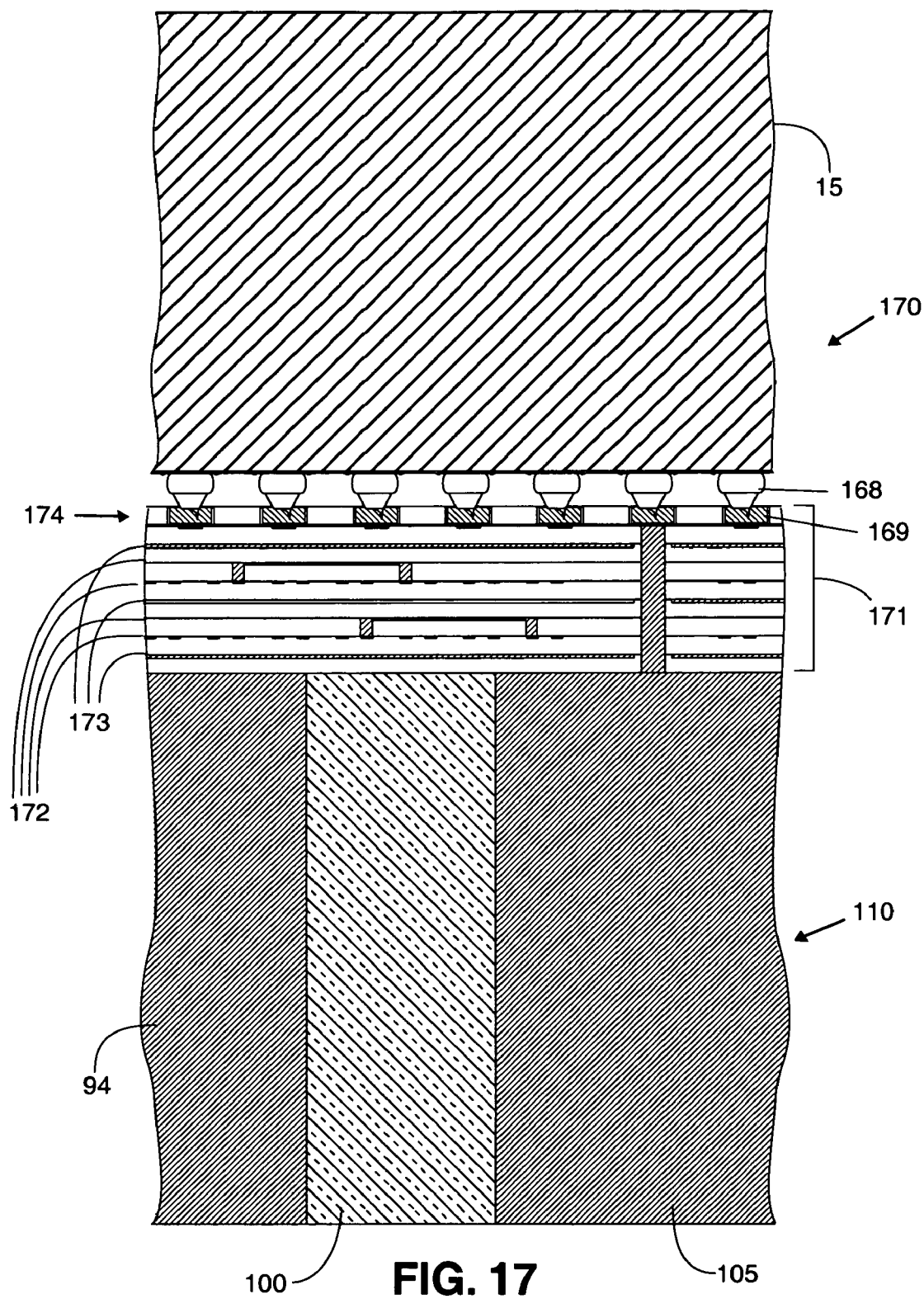
FIG. 17 is a cross-section of a fragment of a module assembly including a conductive substrate with feedthroughs, interconnection circuits, and a flip-chip mounted die.

FIG. 17 shows a scaled fragment of a flip chip assembly 170 using the method of the current invention. Copper substrate 110 of FIG. 12 has feeds for signals and power as previously described, including substrate 94 of FIG. 10, dielectric material 100, and electroplated copper 105. Interconnection circuit 171 includes 4 signal layers 172 and 3 power planes 173, plus a special assembly layer 174 including wells filled with solder 169. Stud bumps 168 of FIG. 16 are attached to I/O pads on IC chips like 15 of FIG. 1 and inserted into wells 169 at a preferred pitch of 100 microns. Because of the good dielectric properties of LCP, and using known methods for creating differential signal pairs having controlled impedance, an assembly represented by FIG. 17 can operate at high frequencies. With copper and LCP both having CTEs of around 17 ppm/° C. and silicon having a CTE of around 3.5 ppm/° C., stress will be induced in assembly 170 as the components cool after the flip chip assembly procedure. The strains arising from these stresses have to be taken up by mechanical compliance of the bump/well structure, plus some compliance of the LCP dielectric. If a copper top plate like 52 of FIG. 6 is employed, everything except the silicon chips will be thermally matched. Since the copper base plate and top plate are typically thicker and stronger than the silicon chips, strain will occur mostly in the silicon chips. However, this strain is acceptable for most IC chips, and a module having matched copper faceplates will not warp significantly during the temperature excursions of typical operating environments. It should be mechanically robust, easily cooled, and electrically quiet (low electromagnetic radiation).

Figure 18:
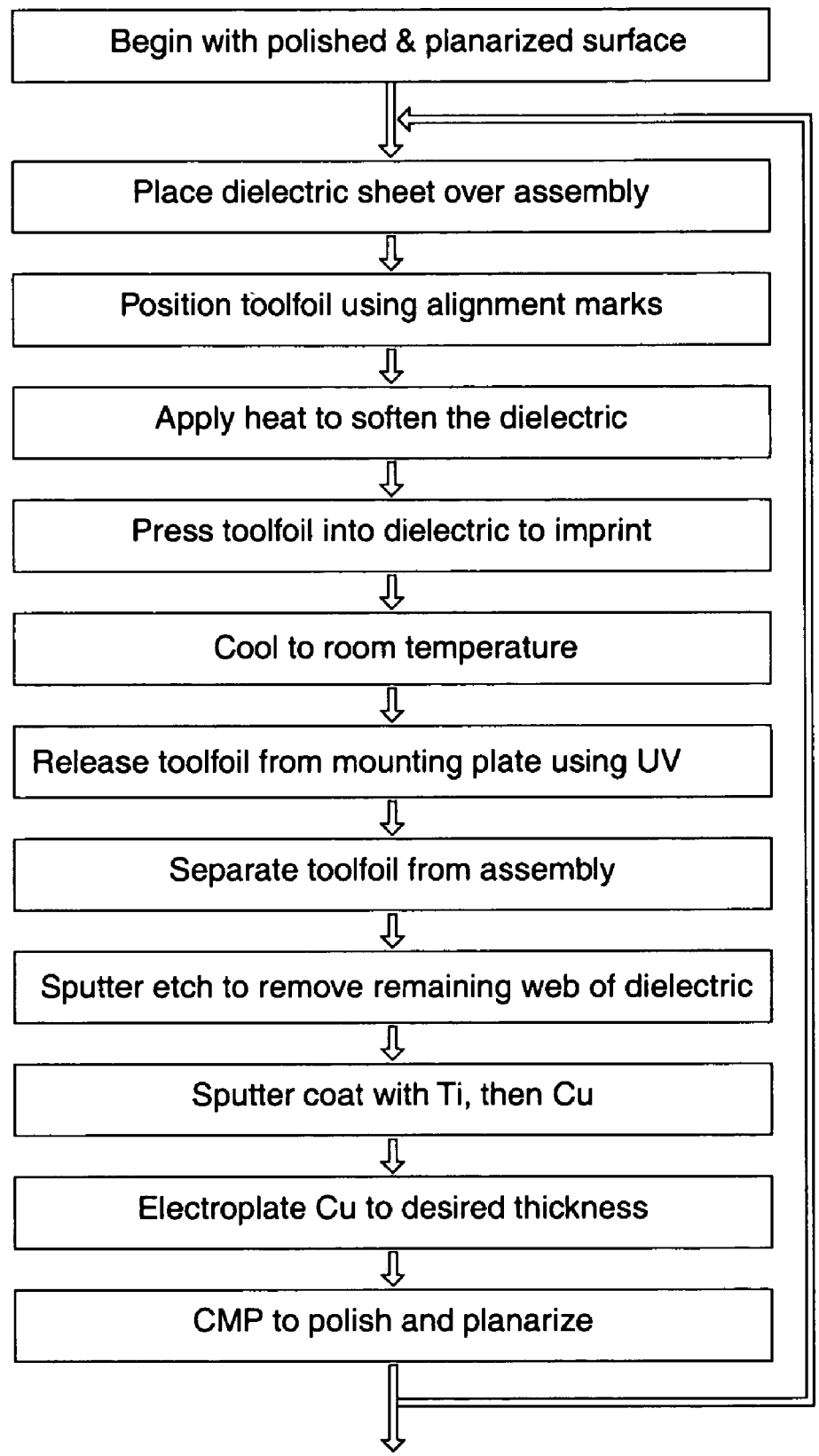
FIG. 18 is a flow chart that summarizes the process steps for imprinting a pair of layers of an interconnection circuit.

FIG. 18 is a summary flow chart of the aforementioned process for creating a pair of interconnection layers, including a conducting layer and a dielectric layer of an interconnection circuit.

Figure 19:
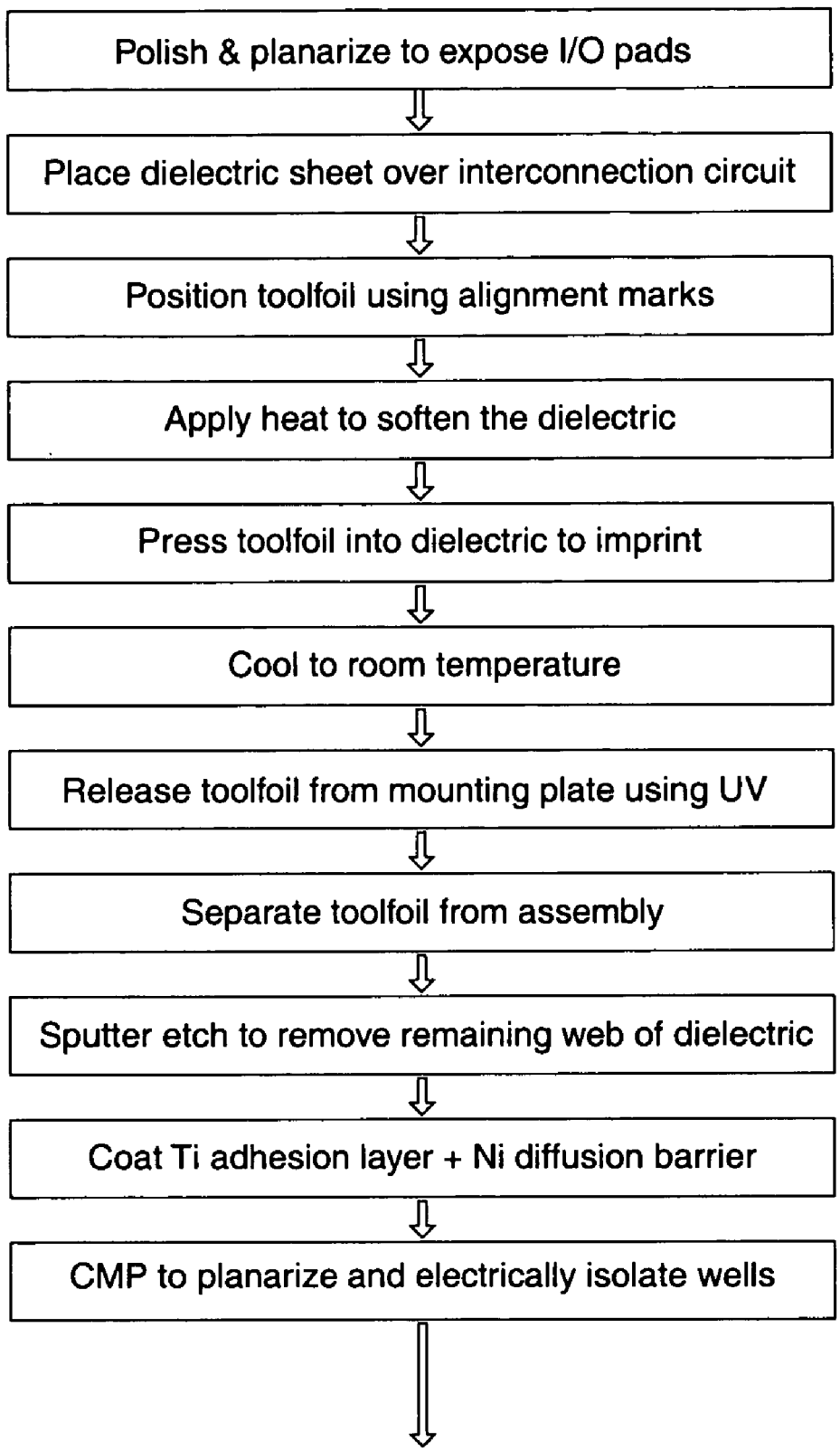
FIG. 19 is a flow chart that summarizes the process steps for imprinting a special assembly layer, including wells for flip chip assembly.

FIG. 19 is a summary flow chart of the additional process steps required to form a special assembly layer including wells that can be filled with solder.

Figure 20:
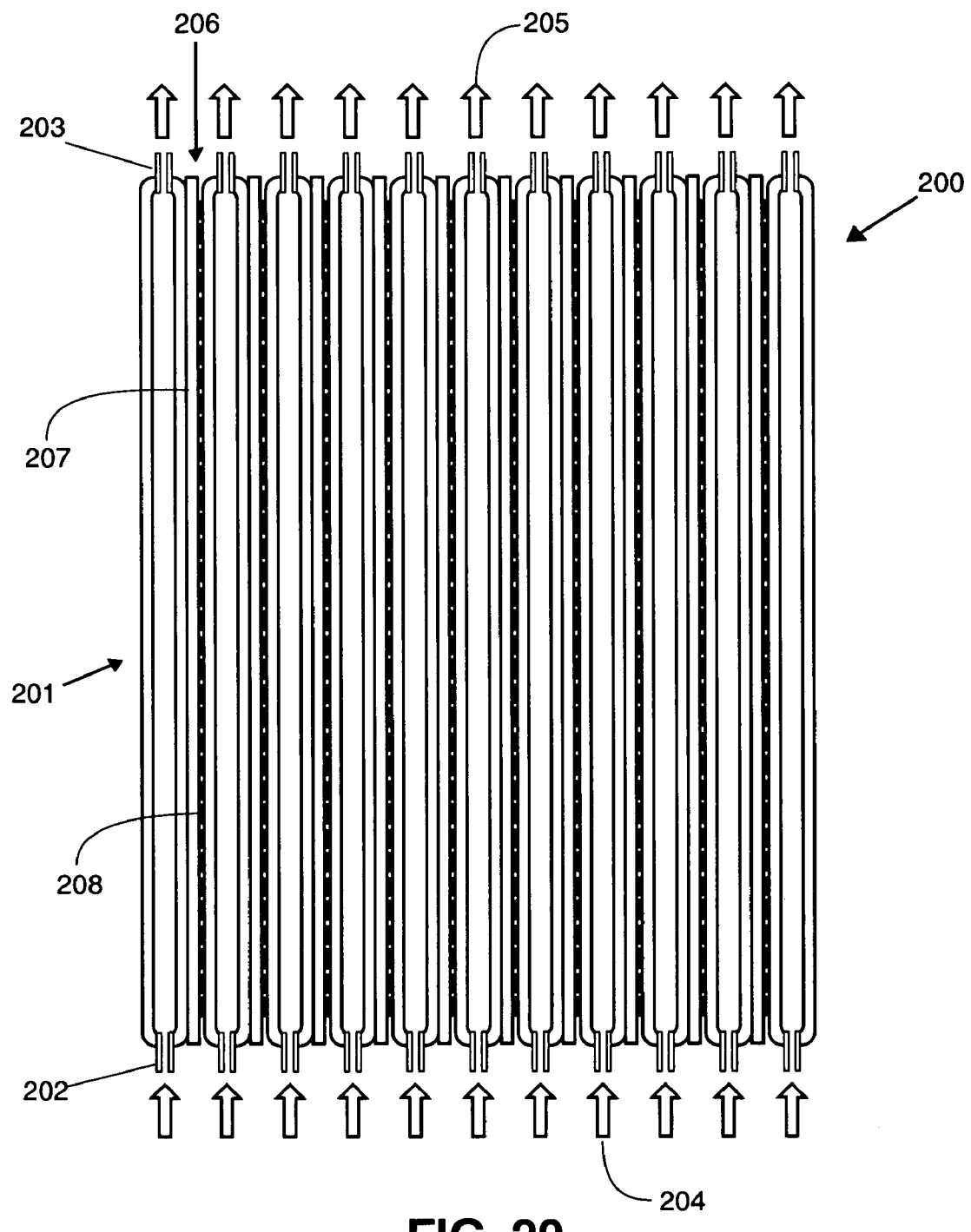
FIG. 20 is a schematic cross-sectional side view of a supercomputer of the current invention.

The copper-faced modules described herein can be integrated into servers and supercomputers to provide greater functional density and better cooling than have been available to date. FIG. 20 is a schematic side view of a supercomputer 200 of the current invention, formed in the approximate shape of a cube. Cooling chambers 201 have a planar shape with a coolant fluid entering at an inlet port 202 and exiting at an outlet port 203. Manifolds (not shown) distribute the incoming fluid flows 204 and the outgoing fluid flows 205 through ports such as 202 and 203. A blade component (or "blade system") 206 is constructed on a conducting substrate 207, and is sandwiched between a pair of cooling chambers 201. Substrate 207 is like an enlarged version of substrate 11 of FIG. 1. IC chips such as 208 are flip chip mounted to blade component 206, preferably using bumps 168 and wells 169 as previously described in reference to FIG. 16. Because the flip chip assembly method provides a high functional density on blade 206, and because cooling chambers 201 can be constructed to have a thin profile, new levels of system density can be achieved. With higher system density, signal paths are shorter and operating speeds are higher. Key factors that enable such large flip chip assemblies include new methods of testing and rework that are described in the background section of this application.

Figure 21:
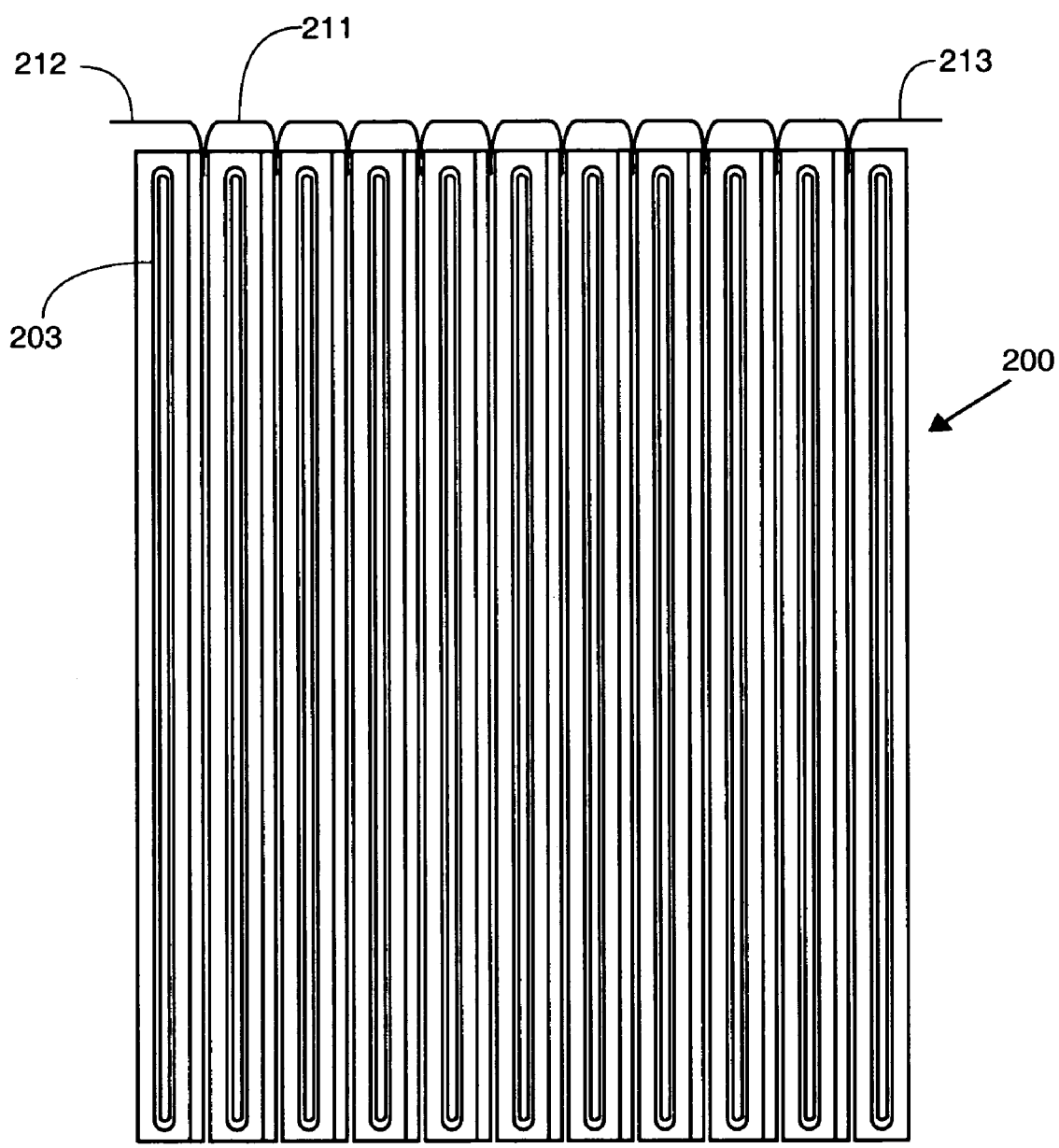
FIG. 21 is a schematic top view of the supercomputer of FIG. 20.

FIG. 21 shows a schematic top view of supercomputer 200 of FIG. 20, showing outlet ports 203. Blade access cables 211 are provided for each blade to connect to each of its neighbors, as will be further described. System input/output cables 212 and 213 are also provided.

Figure 22:
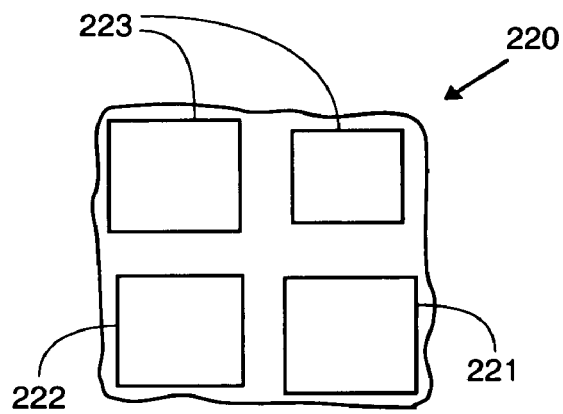
FIG. 22 shows a group of integrated circuit chips including processing, memory, and communication capabilities.

FIG. 22 shows that IC chips may be formed into groups 220, each group preferably containing a computing chip 221, a bus interface chip or other communications chip 222, and one or more memory chips 223.

Figure 23:
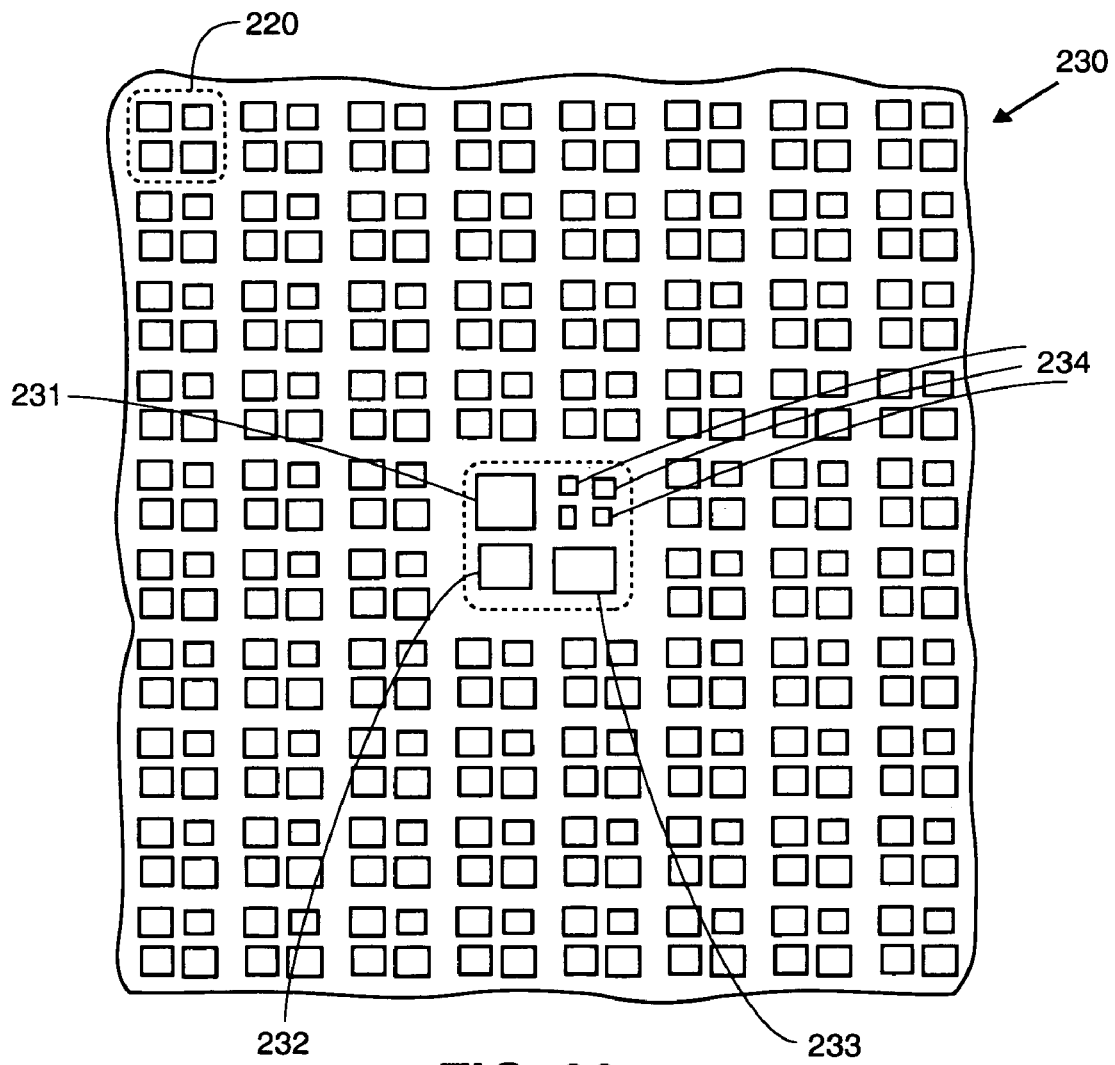
FIG. 23 shows a supergroup of integrated circuit chips including multiple groups defined as in FIG. 22 plus other special purpose chips.

FIG. 23 shows that groups 220 may be integrated into supergroups 230, comprising multiple copies of group 220 plus a single copy of special purpose chips such as may be provided for testing 231, power conversion 232, cross bar switching 233 between pairs of groups or supergroups (for high speed group-to-group communications), and also chips for diagnostics, maintenance and administration 234. Another important function for a special purpose chip may be scheduling of events in preparation for connecting a pair of computing nodes, using a cross bar switch for example. If a failure occurs in a blade system at a commercial business ("in the field"), any required rework will be expensive. Rather than rework any failing elements of such a blade system, it is preferable to provide an administration function that keeps track of defective elements or groups, and automatically switches them out of operation if any defects occur. To detect failures, periodic health checks of all hardware elements may be conducted in the background, using test chips such as 231. The impact of a failed group will be small because it represents a small fraction of the total functionality, and maintenance costs will be minimized.

Figure 24:
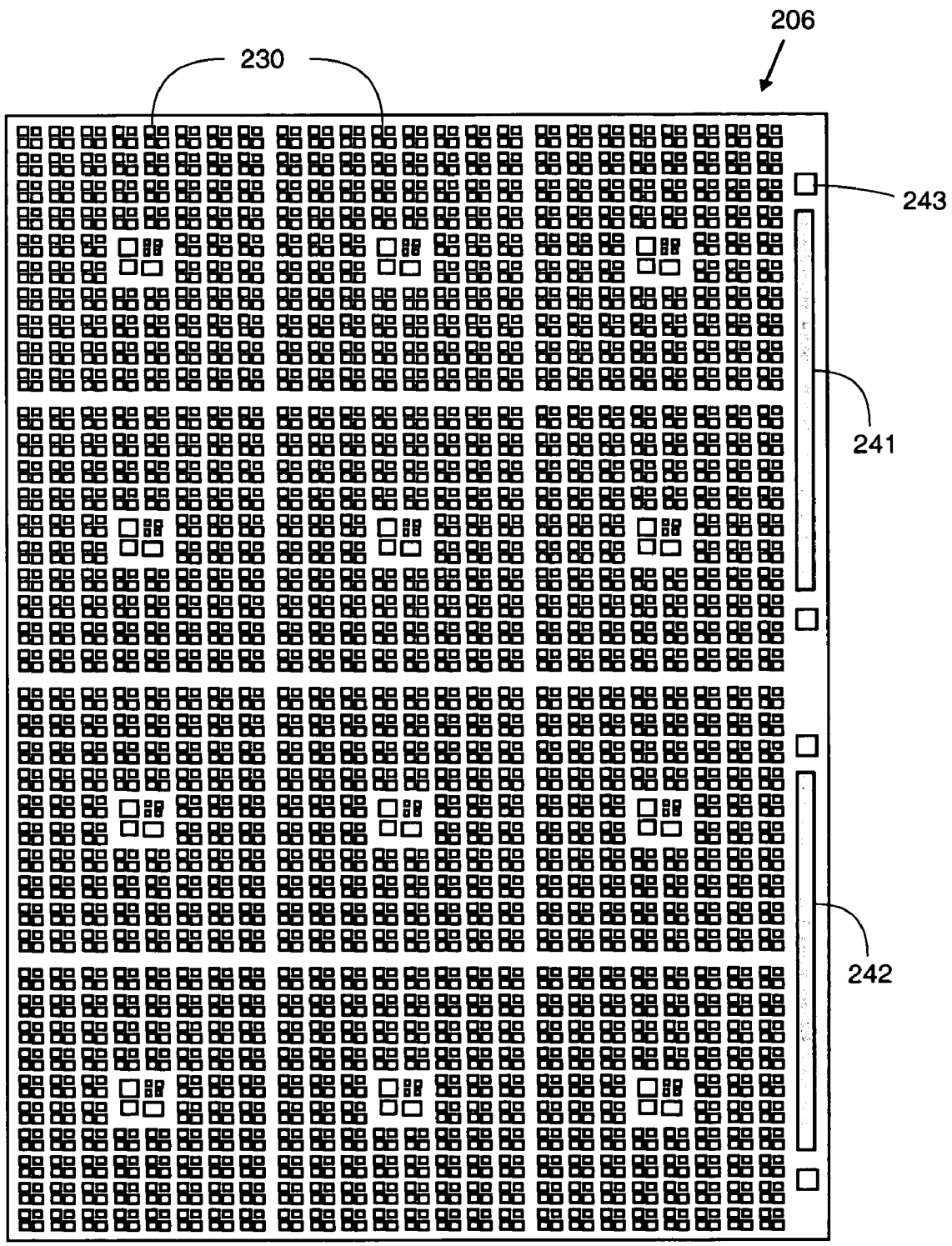
FIG. 24 shows a blade layout including multiple super groups of integrated circuit chips, plus blade access ports.

FIG. 24 shows a top view of blade 206 of FIG. 20 including multiple supergroups 230 as described in FIG. 23 arrayed thereon plus an upper blade access port 241 and a lower blade access port 242. Combining the two access ports on each blade with upper and lower blade access cables like 211 of FIG. 21, it can be seen that each blade can be connected to each of its neighbors. Cable driver/receiver circuits may be implemented on transceiver chips such as 243.

As previously discussed, a semiconductor manufacturing infrastructure exists for flat panels as large as 2 meters on a side. In principle, large toolfoils could be fabricated for imprinting such a large panel in one step; the photo-imaging of such a large toolfoil area could be accomplished using a stepper exposure system, employing photolithographic exposure systems already in service for LCD manufacture. If this is done, the preferred dielectric material (LCP) can be used and high frequency circuits can be produced in large panels using a single imprint cycle. Alternatively, imprinting of large panels can be achieved using a step and repeat imprinting process like the S-Fil process already described.

Figure 25A:
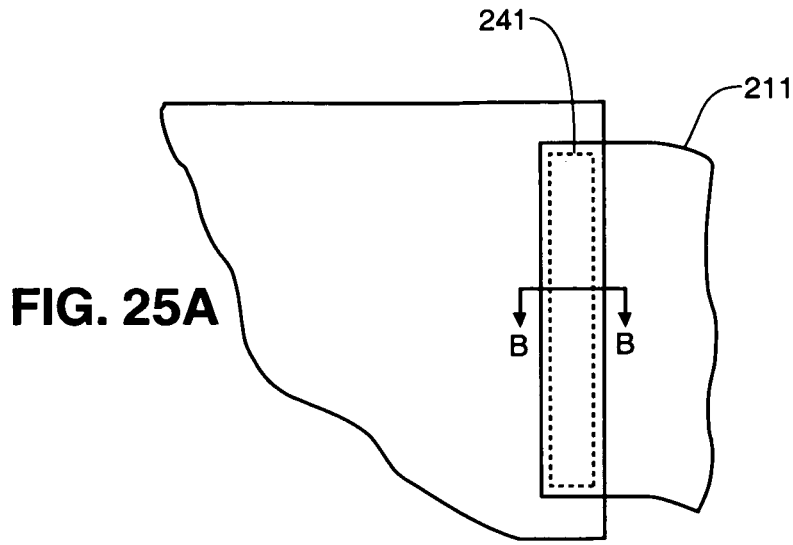
FIG. 25A shows a fragment of a blade computer with a blade access port.
Figure 25B:
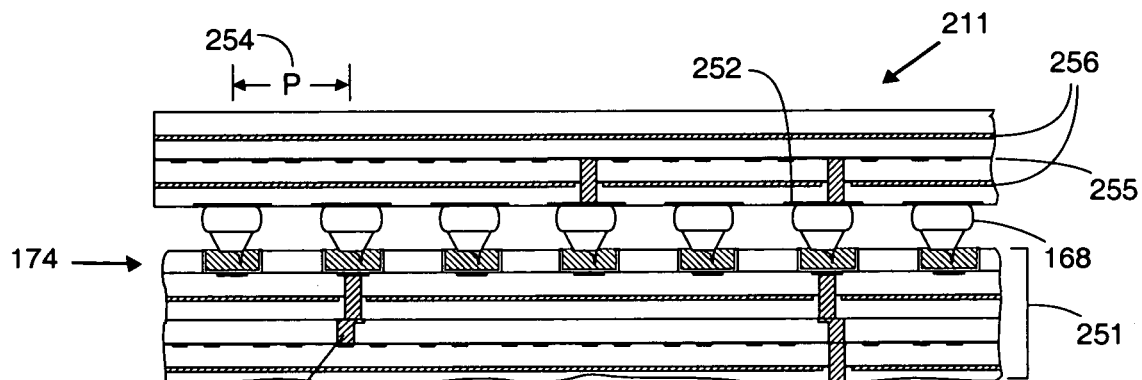
FIG. 25B shows cross-sectional details corresponding to section BB of FIG. 25A.

FIG. 25A shows a blade access cable like 211 of FIG. 21 connecting to upper blade access port 241 of FIG. 24. FIG. 25B shows an expanded cross-sectional view of section BB of FIG. 25A. An interconnection circuit 251 preferably includes multiple signal and power layers plus special assembly layer 174 of FIG. 17. Stud bumps 168 as shown in FIG. 16 connect between input/output pads 252 on cable 211 and corresponding wells filled with solder connecting to traces or nodes 253 of interconnection circuit 251. The pitch P 254 of these bump/well connections is preferably 100 microns. Cable 211 preferably includes a signal layer 255 and two ground layers 256. The arrangement of FIG. 25B supports a connection density of 10,000 connections per square centimeter (at a pad pitch of 100 microns), while also supporting controlled impedances for high frequency operation.

Figure 26:
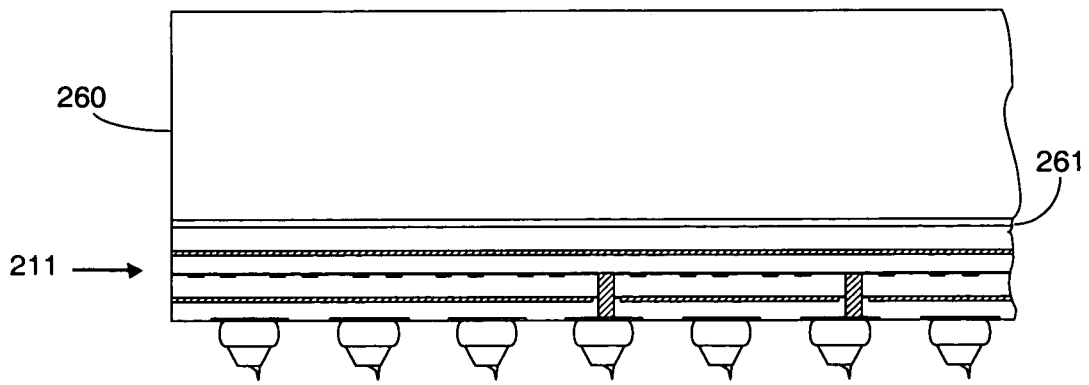
FIG. 26 shows a blade access cable attached to a rigid carrier using a release layer.

For pad pitches as small as 100 microns, as shown in FIG. 25B, dimensional stability during assembly of the parts is essential. Cable 211 includes conductive and dielectric materials that flex; it is a flexible circuit and typically does not exhibit good dimensional stability. Therefore, cable 211 must be supported on a rigid carrier with good dimensional stability until all the connections have been made and tested. Carrier 260 in FIG. 26 provides this capability; in the preferred embodiment it is a glass substrate on which cable 211 is fabricated. Release layer 261 is preferably formed from a UV release material, and release is preferably achieved using intense UV exposure through carrier 260.

What is claimed is:

1. An interconnection circuit board for use with electronic components comprising:
   a copper substrate;
   a first dielectric layer on the copper substrate;
   a plurality of distinct copper traces on the first dielectric layer;
   a second dielectric layer on the copper traces and defining sidewalls of at least a first well having a bottom formed by at least one of the plurality of copper traces;
   a plurality of terminals electrically connected to the respective plurality of copper traces and adapted to permit electrical communication with the electronic components, at least one of the plurality of terminals including a conductive layer on the sidewalls of the at least a first well and conductive material substantially filling the at least a first well.

2. The interconnection circuit board of claim 1 wherein the copper substrate is fabricated with electrically isolated conductive feedthroughs therein.

3. The interconnection circuit board of claim 2 wherein at least some of the conductive feedthroughs electrically connect with at least some of the plurality of copper traces.

4. An electronic module comprising:
   a copper substrate;
   a first dielectric layer on the copper substrate;
   a plurality of distinct copper traces on the first dielectric layer;
   a second dielectric layer on the copper trace layer, the second dielectric layer defining sidewalls of at least a first well, the bottom of the well formed by at least one copper trace;
   terminals electrically connected to the respective copper traces for permitting electrical communication with the electronic components, at least one of the terminals including a conductive layer on the sidewalls of the well and conductive material substantially filling the well;
   an electronic component attached to the at least one terminal.

5. The electronic module of claim 4 wherein the copper substrate is fabricated with electrically isolated conductive feedthroughs therein.

6. The electronic module of claim 4 wherein the electronic component includes an integrated circuit chip.

7. The electronic module of claim 4 wherein the electronic component includes a cable.

8. The electronic module of claim 4 wherein the electronic component includes a wireless transceiver chip.

9. The electronic module of claim 4 further comprising an additional electronic component attached to another of the plurality of terminals.

10. The electronic module of claim 4 further comprising a copper top plate attached to a back face of the electronic component.

11. The electronic module of claim 4 further comprising a chamber attached to a back face of the electronic component and adapted for circulating a coolant fluid.

12. The interconnection circuit board of claim 1 wherein the conductive layer on the sidewalls is formed of a material different than the conductive material substantially filling the at least a first well.

13. The interconnection circuit board of claim 1 wherein the conductive layer on the sidewalls includes nickel and the conductive material substantially filling the well includes a solder paste.

14. The interconnection circuit board of claim 4 wherein the electronic component includes a conductive member protruding from the component and extending into the well for attaching the electronic component to the at least one terminal.

15. The interconnection circuit board of claim 14 wherein the conductive member includes a gold stud bump.

16. The electronic module of claim 4 wherein the conductive layer on the sidewalls comprises a different material than the conductive material substantially filling the well.

17. The electronic module of claim 4 wherein the conductive layer on the sidewalls includes nickel and the conductive material substantially filling the well includes solder paste.

18. The electronic module of claim 4 wherein the second dielectric layer defines a plurality of the wells, each of the wells having a bottom formed by at least one of the conductive traces, each of the terminals comprising conductive material on the sidewalls of a respective one of the wells and conductive material substantially filling each of the wells, the electronic component including a plurality of extending conductive members, the electronic component aligned to the plurality of wells such that the extending conductive members are disposed in the plurality of wells to form an electrical attachment.

* * * * *